United States Patent
Yoon et al.

(10) Patent No.: US 10,731,814 B2
(45) Date of Patent: Aug. 4, 2020

(54) LAMP FOR VEHICLE AND VEHICLE

(71) Applicant: ZKW Group GmbH, Wieselburg (AT)

(72) Inventors: Shinwoo Yoon, Seoul (KR); Juhwan Seol, Seoul (KR); Yongkyo Kim, Seoul (KR)

(73) Assignee: ZKW Group GmbH, Wieselburg (AT)

( * ) Notice: Subject to any disclaimer, the term of this patent is extended or adjusted under 35 U.S.C. 154(b) by 0 days.

(21) Appl. No.: 16/210,678

(22) Filed: Dec. 5, 2018

(65) Prior Publication Data
US 2019/0170311 A1   Jun. 6, 2019

(30) Foreign Application Priority Data
Dec. 5, 2017   (KR) .................. 10-2017-0165885

(51) Int. Cl.
| | |
|---|---|
| *F21S 41/153* | (2018.01) |
| *F21S 41/155* | (2018.01) |
| *F21S 43/31* | (2018.01) |
| *F21S 41/32* | (2018.01) |
| *F21S 43/145* | (2018.01) |
| *F21S 41/255* | (2018.01) |
| *B60Q 1/115* | (2006.01) |
| *F21Y 107/50* | (2016.01) |
| *F21Y 105/12* | (2016.01) |
| *F21Y 115/10* | (2016.01) |
| *F21Y 107/10* | (2016.01) |
| *F21S 43/20* | (2018.01) |
| *H01L 25/075* | (2006.01) |

(Continued)

(52) U.S. Cl.
CPC ........... *F21S 41/153* (2018.01); *B60Q 1/115* (2013.01); *F21S 41/155* (2018.01); *F21S 41/255* (2018.01); *F21S 41/32* (2018.01); *F21S 41/321* (2018.01); *F21S 43/145* (2018.01); *F21S 43/31* (2018.01); *B60Q 1/12* (2013.01); *B60Q 1/20* (2013.01); *F21S 41/33* (2018.01); *F21S 43/14* (2018.01); *F21S 43/255* (2018.01); *F21Y 2105/12* (2016.08); *F21Y 2107/10* (2016.08); *F21Y 2107/50* (2016.08); *F21Y 2107/70* (2016.08); *F21Y 2115/10* (2016.08); *H01L 25/0753* (2013.01)

(58) Field of Classification Search
None
See application file for complete search history.

(56) References Cited

U.S. PATENT DOCUMENTS

| | | | |
|---|---|---|---|
| 2009/0273282 A1* | 11/2009 | Ballard | B60Q 1/2607 315/77 |
| 2013/0112944 A1 | 5/2013 | Cha et al. | |

(Continued)

FOREIGN PATENT DOCUMENTS

| | | | | |
|---|---|---|---|---|
| EP | 2626900 A2 * | 8/2013 | ............ | H01L 27/15 |
| FR | 3019938 | 10/2015 | | |

(Continued)

OTHER PUBLICATIONS

Extended European Search Report in European Application No. 18210326.7, dated Apr. 8, 2019, 9 pages.

*Primary Examiner* — Elmito Breval
(74) *Attorney, Agent, or Firm* — Fish & Richardson P.C.

(57) ABSTRACT

A lamp for a vehicle includes an array module including a plurality of micro Light Emitting Diode (LED) chips. The array module has a shape that is concave in a first direction.

17 Claims, 47 Drawing Sheets

(51) Int. Cl.
*F21Y 107/70* (2016.01)
*F21S 41/33* (2018.01)
*F21S 43/14* (2018.01)
*B60Q 1/12* (2006.01)
*B60Q 1/20* (2006.01)

(56) References Cited

U.S. PATENT DOCUMENTS

2013/0286664 A1 10/2013 Wang
2015/0280152 A1 10/2015 Iwagaki et al.

FOREIGN PATENT DOCUMENTS

| | | |
|---|---|---|
| JP | 2002184209 | 6/2002 |
| JP | 2008277071 | 11/2008 |
| JP | 2008288224 | 11/2008 |
| JP | 2011249535 | 12/2011 |
| KR | 1020110040695 | 4/2011 |
| KR | 1020120055568 | 5/2012 |
| WO | WO2010014032 | 2/2010 |

\* cited by examiner

FIG. 1
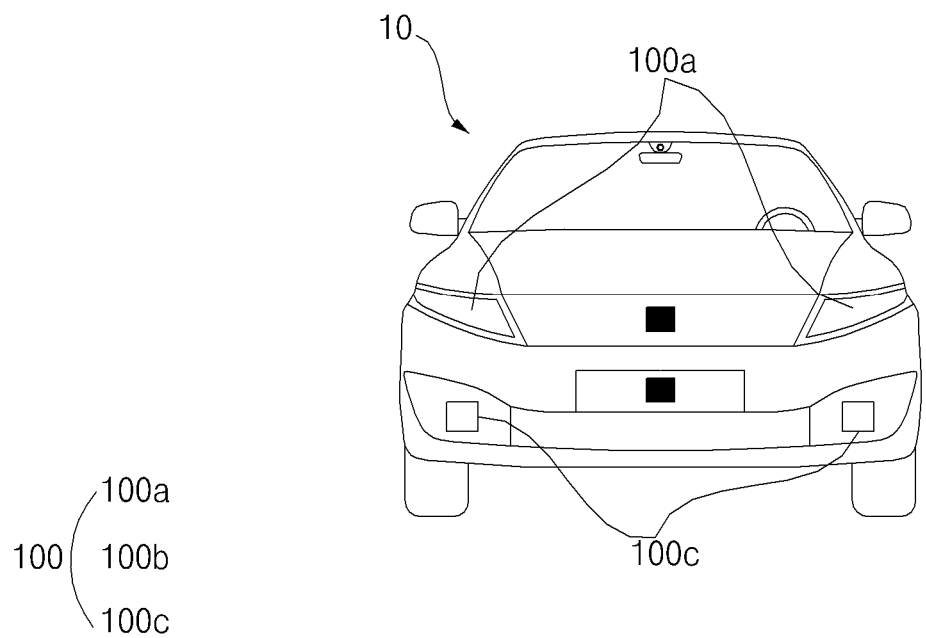
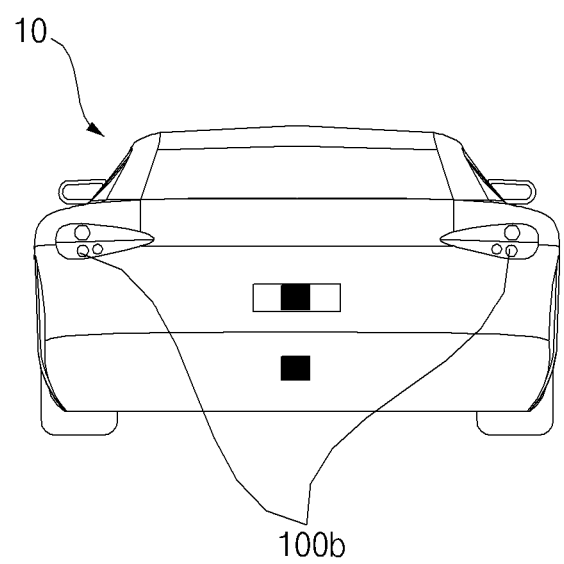

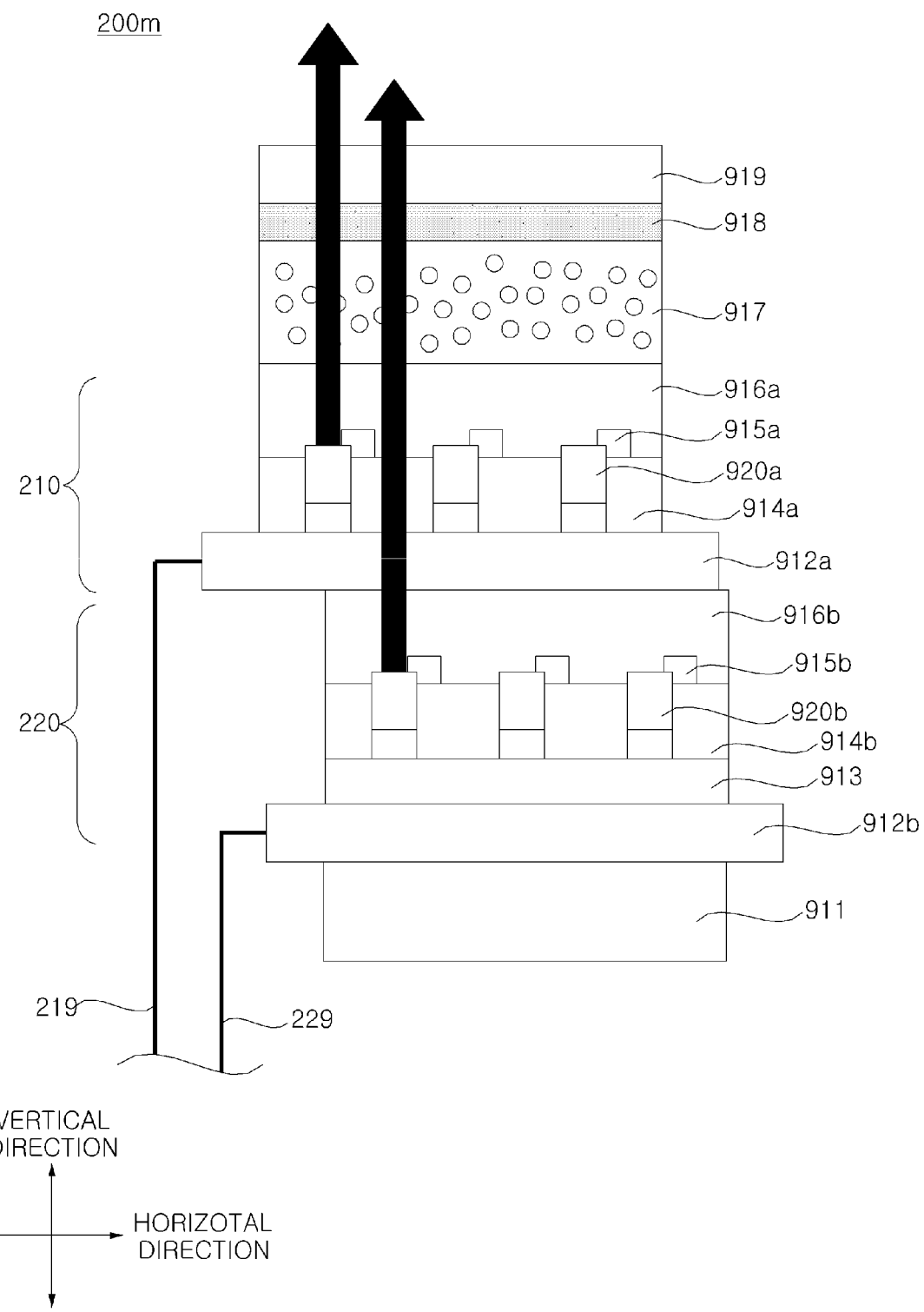

FIRST DIRECTION ←→ SECOND DIRECTION

FIRST DIRECTION ←————————→ SECOND DIRECTION

FIRST DIRECTION ←——————————————→ SECOND DIRECTION

FIRST DIRECTION ◄──────────────► SECOND DIRECTION

2710

LAMP FOR VEHICLE AND VEHICLE

CROSS-REFERENCE TO RELATED APPLICATION

This application claims the priority benefit of Korean Patent Application No. 10-2017-0165885, filed on Dec. 5, 2017, in the Korean Intellectual Property Office, the disclosure of which is incorporated herein by reference.

FIELD

The present disclosure relates to a lamp for a vehicle, and the vehicle.

BACKGROUND

A vehicle is an apparatus that can transport a user in a direction desired by the user. One example of a vehicle may be an automobile.

A vehicle may include lamps that may be classified as lamps for securing visibility for a driver (e.g., a head lamp and a fog lamp), and lamps for notifying a simple signal (e.g., a rear combination lamp).

Various devices may be used as light sources of the lamps provided in a vehicle.

Recently, there have been efforts to utilize a plurality of micro Light Emitting Diode (LED) chips as light sources of the lamps for vehicle.

It is of interest to enhance light output efficiency of a vehicular lamp including a plurality of micro LED chips while ensuring visibility for a driver and transmitting a notifying signal from the vehicle.

SUMMARY

The present disclosure provides a lamp for a vehicle, which includes a parabolic array module.

The present disclosure also provides a vehicle including the lamp.

Objects of the present disclosure should not be limited to the aforementioned objects and other unmentioned objects will be clearly understood by those skilled in the art from the following description.

According to one aspect of the subject matter described in this application, a lamp for a vehicle includes an array module including a plurality of micro Light Emitting Diode (LED) chips. The array module has a shape that is concave in a first direction.

Implementations according to this aspect may include one or more of the following features. For example, the array module includes one or more stepped portions. In some examples, the array module includes a plurality of first regions oriented toward a second direction opposite to the first direction, and a plurality of second regions oriented toward at least a portion of the array module, where at least a portion of the plurality of micro LED chips is disposed in the plurality of first regions.

In some examples, a length of each of the plurality of second regions decreases in a direction toward a center of the array module. In some examples, a number of micro LED chips is determined based on a unit width, and the number of micro LED chips disposed in the plurality of first regions increases in a direction toward a center of the array module. In some implementations, at least a portion of the plurality of micro LED chips is disposed in the plurality of second regions.

In some implementations, the lamp may further include a three-dimensional (3D) reflector configured to reflect light generated by the plurality of micro LED chips disposed in the plurality of second regions. In some examples, the 3D reflector extends in the second direction, where a cross-sectional area of the 3D reflector decreases in the second direction from a center point of the array module. In some examples, a longitudinal cross-section of the 3D reflector has a polygonal shape or a circular shape.

In some implementations, the array module defines a hole having a shape corresponding to a shape of a cross-section of the 3D reflector. In some examples, the array module further includes a plurality of subarray modules. In some examples, each of the plurality of subarray modules includes at least one region having a width that increases in a direction from a center of the array module toward a periphery of the array module in a state in which the array module is developed into one plane.

In some implementations, each of the plurality of subarray modules includes, in the state in which the array module is developed into one plane: a first side that extends from the center of the array module to the periphery of the array module; and a second side that contacts the first side at the center of the array module and that extends from the center of the array module to the periphery of the array module. The first side and the second side may define a predetermined angle about the center of the array module.

In some implementations, an interval between the plurality of subarray modules increases from the center of the array module toward the periphery of the array module in the view in which the array module is developed into one plane. In some examples, each of the plurality of subarray modules has a fan shape. The plurality of subarray modules are configured to couple to one another, where an interval between the plurality of subarray modules increases in a direction from a center of the fan shape toward an arc of the fan shape in a state in which the plurality of subarray modules are spaced apart from one another.

In some implementations, the lamp may further include a lens configured to transmit light emitted from the array module, where the array module has a 3D shape in which the plurality of subarray modules are arranged. A distance from a periphery of each of the plurality of subarray modules to an optical axis of the lens may be greater than a distance from a center of each of the plurality of subarray modules to the optical axis of the lens. In some examples, each of the plurality of subarray modules is configured to bend in one or more directions with respect to the optical axis of the lens.

In some implementations, each of the plurality of subarray modules includes a plurality of unit array modules, where each of the plurality of subarray modules has at least one of a triangle shape, a rectangle shape, or a hexagon shape. In some examples, each of the subarray modules includes a bending portion that does not include the plurality of micro LED chips, where the plurality of first regions are configured to be distinguished from the plurality of second regions based on the bending portion. In some examples, one of the plurality of first regions defines a vertical cross-section by a plane crossing the first direction, where the vertical cross-section has a ring shape.

The details of other implementations are included in the following description and the accompanying drawings.

The implementations of the present disclosure have one or more effects as follows.

First, it is possible to uniformly output light to the outside.

Second, it is possible to reduce the size of a lens system, thereby making the size of the whole lamp for a vehicle small.

Third, it is possible to secure a sufficient amount of light even with using a plurality of micro LED chips.

Effects of the present disclosure should not be limited to the aforementioned effects and other unmentioned effects will be clearly understood by those skilled in the art from the claims.

BRIEF DESCRIPTION OF THE DRAWINGS

The implementations will be described in detail with reference to the following drawings in which like reference numerals refer to like elements.

FIG. 1 is a diagram illustrating an example exterior appearance of an example vehicle.

FIG. 8 is a diagram illustrating an example array module including a plurality of micro LED chips and an example arrangement of the plurality of micro LED chips.

DETAILED DESCRIPTION

Figure 2:
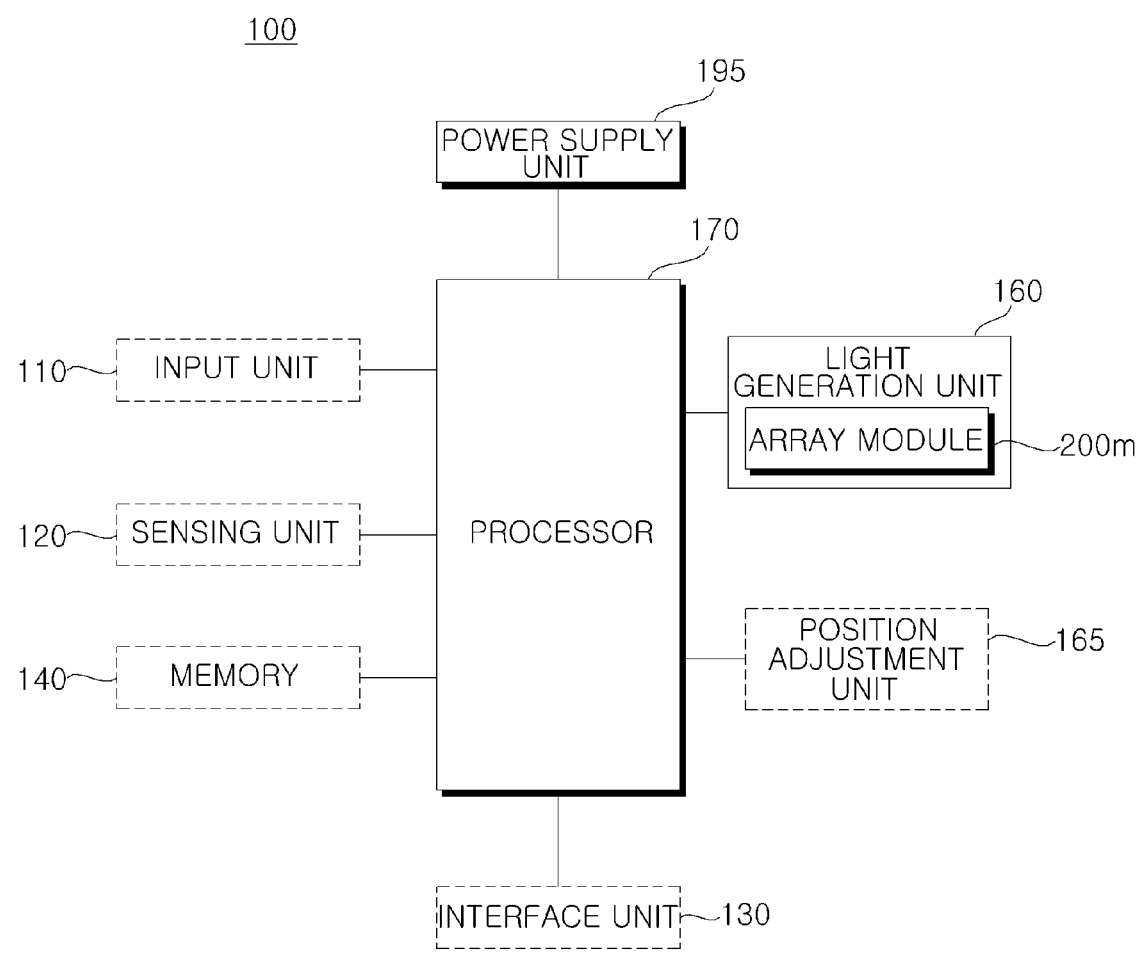
FIG. 2 is a block diagram illustrating an example lamp for a vehicle.

Hereinafter, the implementations disclosed in the present specification will be described in detail with reference to the accompanying drawings, and the same or similar elements are denoted by the same reference numerals even though they are depicted in different drawings and redundant descriptions thereof will be omitted.

A vehicle as described in this specification may include, but not be limited to, an automobile and a motorcycle. Hereinafter, a description will be given based on an automobile.

A vehicle as described in this specification may include one or more of an internal combustion engine vehicle including an engine as a power source, a hybrid vehicle including both an engine and an electric motor as a power source, or an electric vehicle including an electric motor as a power source.

In the following description, "the left side of the vehicle" refers to the left side in the forward driving direction of the vehicle, and "the right side of the vehicle" refers to the right side in the forward driving direction of the vehicle.

In the following description, an array module 200m may include one or more arrays.

The array module 200m may include one or more layers, and one array may be disposed on one layer.

FIG. 1 is a diagram illustrating an example exterior appearance of an example.

Referring to FIG. 1, a vehicle 10 may include a lamp 100.

The lamp 100 may include a head lamp 100a, a rear combination lamp 100b, and a fog lamp 100c.

The lamp 100 may further include a room lamp, a turn signal lamp, a daytime running lamp, a back lamp, a positioning lamp, etc.

In some implementations, the term "overall length" refers to the length from the front end to the rear end of the vehicle 10, the term "overall width" refers to the width of the vehicle 10, and the term "overall height" refers to the height from the bottom of the wheel to the roof. In the following description, the term "overall length direction L" may be the reference direction for the measurement of the overall length of the vehicle 10, the term "overall width direction W" may be the reference direction for the measurement of the overall width of the vehicle 10, and the term "overall height direction H" may be the reference direction for the measurement of the overall height of the vehicle 10.

FIG. 2 is a block diagram illustrating an example lamp for a vehicle.

Referring to FIG. 2, the lamp 100 may include a light generation unit 160, a processor 170, and a power supply unit 195.

The lamp 100 may further include an input unit 110, a sensing unit 120, an interface unit 130, a memory 140, and a position adjustment unit 165 individually or in combination thereof.

The input unit 110 may receive a user input for controlling the lamp 100.

The input unit 110 may include one or more input devices. For example, the input unit 110 may include at least one selected from among a touch input device, a mechanical input device, a gesture input device, and a sound input device.

The input unit 110 may receive a user input for controlling operation of the light generation unit 160.

For example, the input unit 110 may receive a user input for turning on or off the light generation unit 160.

The sensing unit 120 may include one or more sensors.

For example, the sensing unit 120 may include either or both of a temperature sensor and an illumination sensor.

The sensing unit 120 may acquire temperature information of the light generation unit 160.

The sensing unit 120 may acquire illumination information about the outside of the vehicle 10.

The interface unit 130 may exchange information, data, or a signal with another device provided in the vehicle 10.

The interface unit 130 may transmit at least one of information, data, or a signal, received from another device provided in the vehicle 10, to the processor 170.

The interface unit 130 may transmit at least one of information, data, or a signal, generated by the processor 170, to another device provided in the vehicle 10.

The interface unit 130 may receive driving situation information.

The driving situation information may include at least one of the following: information about an object outside the vehicle 10, navigation information, or vehicle state information.

The information about an object outside the vehicle 10 may include the following: information about the presence of the object, information about a location of the object, information about movement of the object, information about a distance between the vehicle 10 and the object, information about a relative speed between the vehicle 10 and the object, and information about a type of the object.

The information about the object may be generated by an object detection apparatus provided in the vehicle 10. The object detection apparatus may detect an object based on sensing data generated by one or more of a camera, a radar, a lidar, an ultrasonic sensor, and an infrared sensor.

The object may include a line, another vehicle, a pedestrian, a two-wheeled vehicle, a traffic sign, light, a road, a structure, a bump, a geographic feature, an animal, etc.

The navigation information may include at least one of the following: map information, information on a set destination, information on a route to the set destination, and information on various object located along the route, lane information, or information on the current location of the vehicle 10.

The navigation information may be generated by a navigation device provided in the vehicle 10.

The vehicle state information may include at least one of the following: vehicle position information, vehicle speed information, vehicle tilt information, vehicle weight information, vehicle direction information, vehicle battery information, vehicle fuel information, vehicle tire pressure information, vehicle steering information, in-vehicle temperature information, in-vehicle humidity information, pedal position information, or vehicle engine temperature information, among other things.

The vehicle state information may be generated based on sensing information about any of various sensors provided in the vehicle 10.

The memory 140 may store basic data for each unit of the lamp 100, control data for the operational control of each unit of the lamp 100, and input/output data of the lamp 100.

The memory 140 may be any of various hardware storage devices, such as a ROM, a RAM, an EPROM, a flash drive, and a hard drive.

The memory 140 may store various data for the overall operation of the lamp 100, such as programs for the processing or control of the processor 170.

The memory 140 may be classified as a sub-element of the processor 170.

The light generation unit 160 may convert electrical energy into light energy under the control of the processor 170.

The light generation unit 160 may include an array module 200m in which multiple groups of micro Light Emitting Diode (LED) chips are arranged.

The array module 200m may be formed flexible.

For example, the array 200 may be formed flexible in a manner such that a Flexible Copper Clad Laminated (FCCL) substrate is disposed on a polyimide (PI) layer and then LED chips each few micrometers (um) are transferred onto the FCCL substrate.

The array module 200m may include one or more micro LED arrays 200.

In some implementations, the array module 200m may be formed such that a plurality of arrays are deposited on each other.

The multiple groups of micro LED chips may have different shapes.

A micro LED chip may be referred to as a micro LED light emitting device package.

A micro LED chip may include a light emitting device.

A micro LED chip may be of a few micrometers (um). For example, a micro LED chip may be 5-15 um.

A light emitting device of a micro LED chip may be transferred onto a substrate.

The array 200 may include a substrate, and a unit array in which a plurality of micro LED chips are arranged. In the array, one or more unit arrays may be provided.

The unit array may have any of various shapes.

For example, the unit array may be in the shape of a figure of a predetermined area.

For example, the unit array may be in the shape of a circle, a polygon, a fan, etc.

It is desirable that the substrate include an FCCL substrate.

For example, a base 911 (see FIG. 5) and a first electrode 912 (see FIG. 5) may make up the substrate.

For example, a base 911 (see FIG. 8) and a second anode 912b (see FIG. 8) may make up a substrate.

In some implementations, the array module 200m may function as a surface light source.

The position adjustment unit 165 may adjust position of the light generation unit 160.

The position adjustment unit 165 may control the light generation unit 160 to be tilted. Due to the tilting control of the light generation unit 160, an output light may be adjusted in an upward-downward direction (e.g., an overall height direction).

The position adjustment unit 165 may control the light generation unit 160 to be panned. Due to the panning control of the light generation unit 160, an output light may be adjusted in a left-right direction (e.g., an overall width direction).

The position adjustment unit 165 may further include a driving force generation unit (e.g., a motor, an actuator, and a solenoid) which provides a driving force required to adjust a position of the light generation unit 160.

When the light generation unit 160 generates a low beam, the position adjustment unit 165 may adjust a position of the light generation unit 160 so that the light generation unit 160 outputs a light downward further than when generating a high beam.

When the light generation unit 160 generates a high beam, the position adjustment unit 165 may adjust a position of the light generation unit 160 so that the light generation unit 160 outputs a light upward further than when generating a low beam.

The processor 170 may be electrically connected to each unit of the lamp 100. The processor 170 may control overall operation of each unit of the lamp 100.

The processor 170 may control the light generation unit 160.

The processor 170 may control the light generation unit 160 by adjusting an amount of electrical energy to be supplied to the light generation unit 160.

The processor 170 may control the array module 200m on the basis of each region.

For example, the processor 170 may control the array module 200m on the basis of each region by supplying a different amount of electrical energy to micro LED chips arranged in each region of the array module 200m.

The processor 170 may control the array module 200m on the basis of each layer.

A plurality of layers in the array module 200m may be composed of a plurality of arrays 200.

For example, the processor 170 may control the array module 200m on the basis of each layer by supplying a different amount of electrical energy to each layer.

Under the control of the processor 170, the power supply unit 195 may supply electrical energy required to operate each unit of the lamp 100. In particular, the power supply unit 195 may be supplied with power from a battery inside the vehicle 10.

Figure 3A:
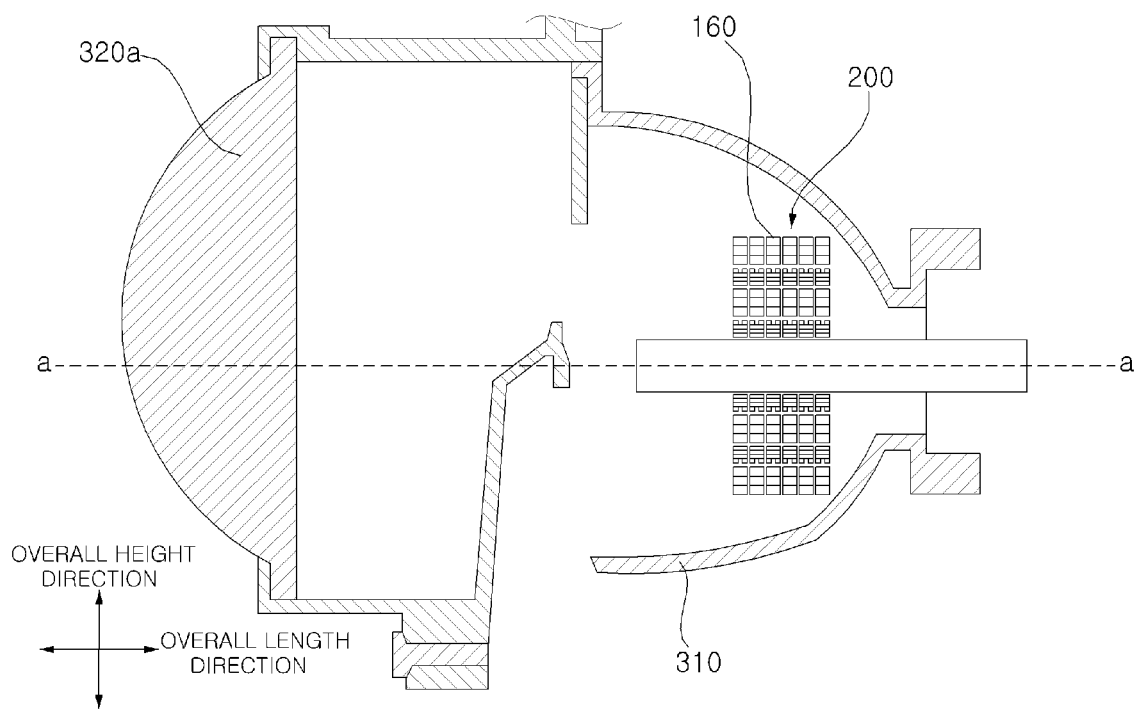
FIGS. 3A to 3C are diagrams illustrating an example lamp for a vehicle.
Figure 3B:
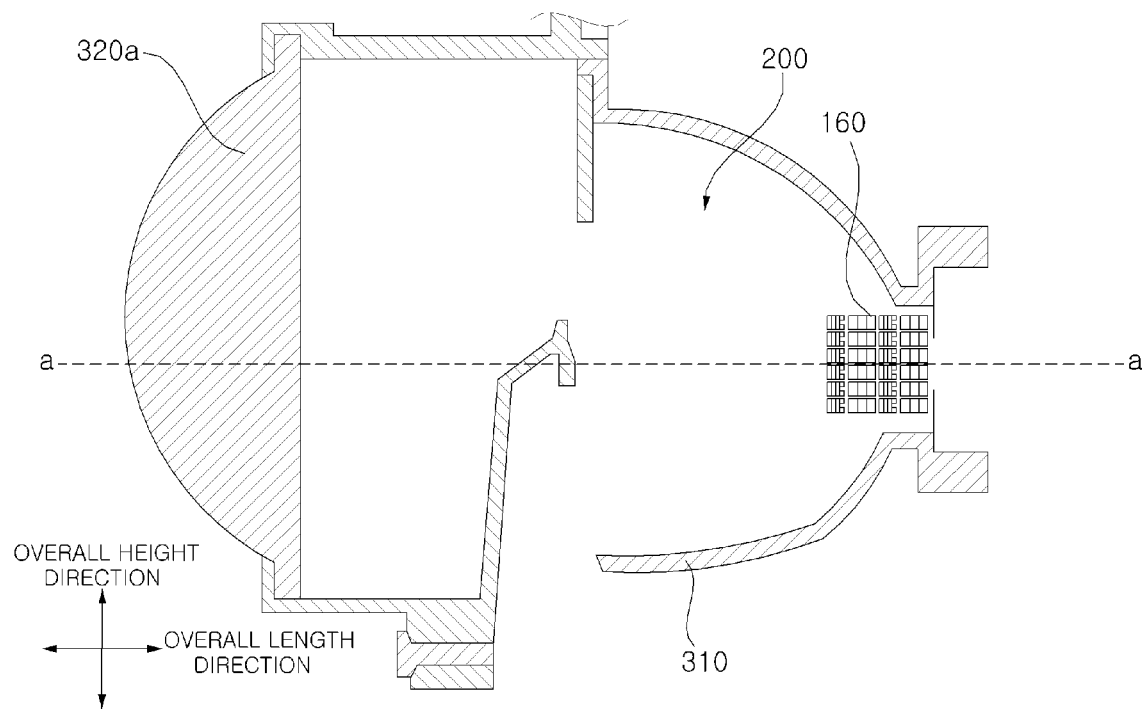
Figure 3C:
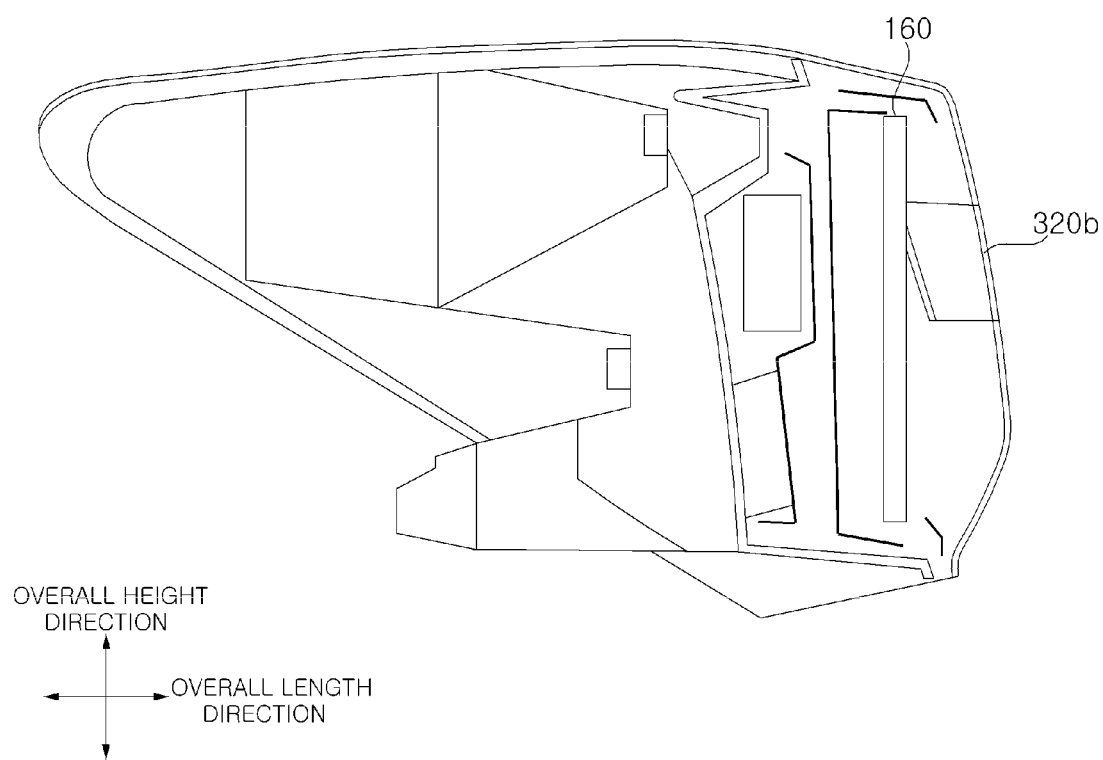

FIGS. 3A to 3C are diagrams illustrating a lamp for a vehicle.

FIGS. 3A and 3B are examples of a section of the lamp 100 implemented as a head lamp 100a.

Referring to FIGS. 3A and 3B, the lamp 100 may include a light generation unit 160, a reflector 310, and a lens 320a.

The reflector 310 may reflect light generated by the light generation unit 160. The reflector 310 may guide light to be emitted forward or rearward of the vehicle 10.

The reflector 310 may be formed of a highly reflective material, such as aluminum (AL) and silver (Ag), or may be coated on a reflective surface.

The lens 320a may be disposed before the light generation unit 160 and the reflector 310. The lens 320a may refract light generated by the light generation unit 160 or light reflected by the reflector 310, and allow the refracted light to pass therethrough. The lens 320a may be an aspheric lens.

The lens 320a may change an optical path of light generated by the light generation unit 160.

The lens 320a may be formed of a transparent synthetic resin or glass.

As illustrated in FIG. 3A, the light generation unit 160 may output light in an overall height direction.

As illustrated in FIG. 3B, the light generation unit 160 may output light in an overall length direction.

FIG. 3C is a diagram illustrating an example lamp for a vehicle.

FIG. 3C is an example of a section of the lamp 100 implemented as a rear combination lamp 200b.

Referring to FIG. 3C, the lamp 100 may include a light generation unit 160 and a lens 320b.

The lens 320b may cover the light generation unit 160. The lens 320b may refract light generated by the light generation unit 160, and allow the refracted light to pass therethrough. The lens 320b may be an aspheric lens.

The lens 320b may change an optical path of light generated by the light generation unit 160.

The lens 320b may be formed of a transparent synthetic resin or glass.

Figure 4:
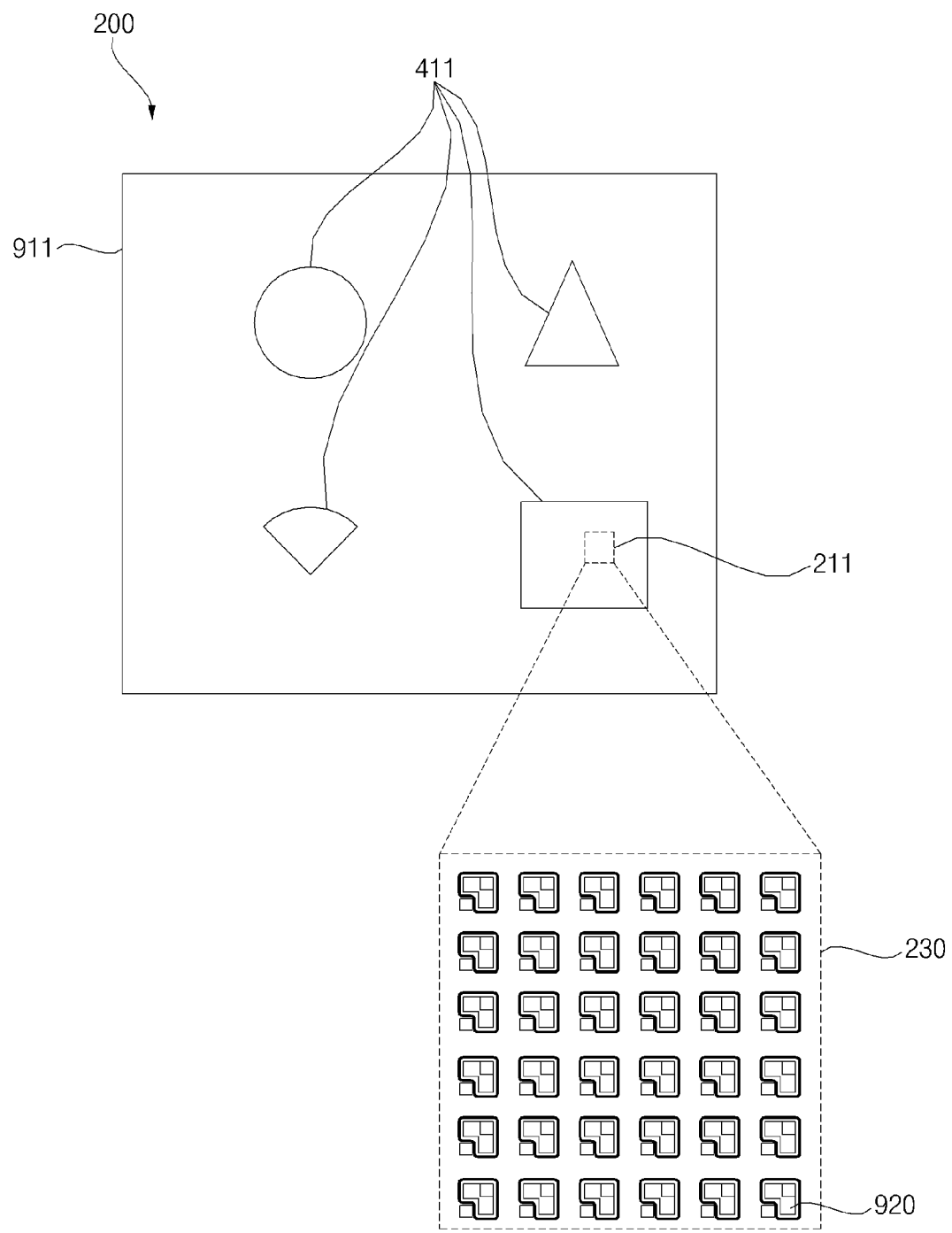
FIG. 4 is a diagram illustrating an example array including a plurality of micro LED chips and an example arrangement of the plurality of micro LED chips.

FIG. 4 is a diagram illustrating an example array including a plurality of micro LED chips and an example arrangement of the plurality of micro LED chips.

Referring to FIG. 4, a plurality of micro LED chips 920 may be disposed on an array 200.

The plurality of micro LED chips 920 may be transferred onto the array 200.

An interval between micro LED chips 920 on the flexible array 200, and a density of micro LED chips 920 (that is, the number of micro LED chips per unit area) on the flexible array 200 may be determined depending on a transfer interval.

The array 200 may include a plurality of unit arrays 411 in which different groups of micro LED chips are arranged respectively.

The array 200 may include a base 911 and one or more unit arrays 411.

The base 911 may be formed of a material such as a polyimide (PI).

In some implementations, the base 911 may be a concept including a polyimide layer and an FCCL substrate disposed on the polyimide layer.

Each of the unit arrays 411 may be disposed on the base 911.

A plurality of micro LED chips 920 may be disposed on each of the unit arrays 411.

The unit arrays 411 may be made by cutting a main array that is an FCCL substrate on which a plurality of micro LED chips 920 is disposed.

In this case, the shape of each unit array 411 may be determined by a shape into which the main array is cut.

For example, each of the unit arrays 411 may have the shape of a two-dimensional figure (e.g., a circle, a polygon, and a fan).

Figure 5:
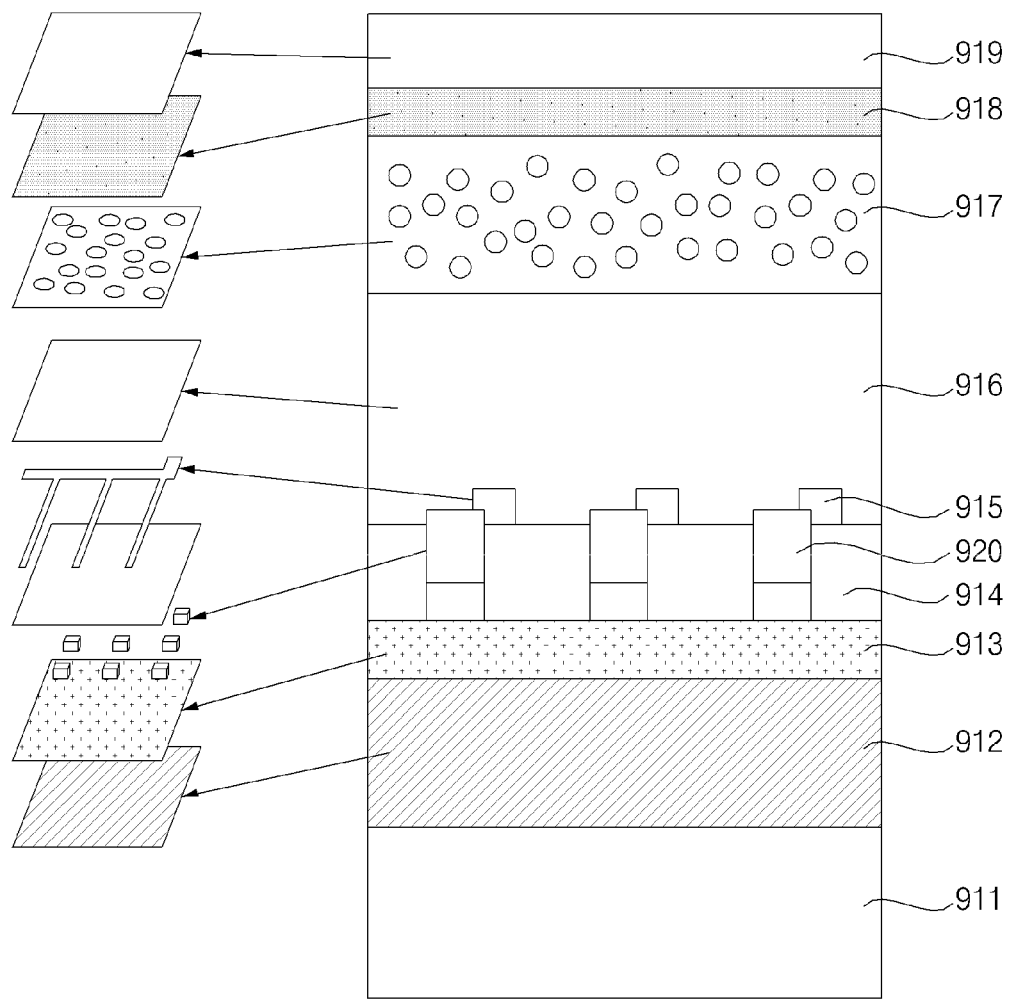
FIG. 5 is a diagram illustrating an example array including micro LED chips and an example arrangement of the micro LED chips.

FIG. 5 is a diagram illustrating an example array including micro LED chips and an example arrangement of the micro LED chips.

Referring to FIG. 5, the array 200 may include a polyimide layer 911, a FCCL substrate 912, a reflective layer 913, an inter-layer dielectric film 914, a plurality of micro LED chips 920, a second electrode 915, an optical spacer 916, a phosphor layer 917, a color filter film 918, and a cover film 919.

The polyimide layer 911 may be formed flexible.

The FCCL substrate 912 may be formed of copper. The FCCL substrate 912 may be referred to as a first electrode.

In some implementations, the polyimide layer 911 may be referred to as a base.

The first electrode and the second electrode may be electrically connected to the plurality of micro LED chips 920 so as to supply power thereto.

The first electrode 912 and the second electrode 915 may be light transmissive electrodes.

The first electrode 912 may be an anode.

The second electrode 915 may be a cathode.

The first electrode 912 and the second electrode 915 may a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first electrode 912 may be formed between the polyimide layer 911 and the reflective layer 913.

The second electrode 915 may be formed on the inter-layer dielectric film 914.

The reflective layer 913 may be formed on the FCCL substrate 912. The reflective layer 913 may reflect light generated by the plurality of micro LED chips 920. It is desirable that the reflective layer 913 may be formed of silver Ag.

The inter-layer dielectric film 914 may be formed on the reflective layer 913.

The plurality of micro LED chips 920 may be formed on the FCCL substrate 912. Each of the plurality of micro LED chips 920 may be attached to the reflective layer 913 or the FCCL substrate 912 using a solder material or an Anisotropic Conductive Film (ACF).

In some implementations, a micro LED chip 920 may be an LEC chip of 10-100 μm.

The optical spacer 916 may be formed on the inter-layer dielectric film 914. The optical spacer 916 may be used to keep a distance between the plurality of micro LED chips 920 and the phosphor layer 917, and may be formed of an insulating material.

The phosphor layer 917 may be formed on the optical spacer 916. The phosphor layer 917 may be formed of resin in which a phosphor is evenly distributed. Depending on a wavelength of light emitted from a micro LED chips 920, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

That is, a phosphor may be excited by light of a first color, which is emitted from the micro LED chips 920, to thereby generate light of a second color.

The color filter film 918 may be formed on the phosphor layer 917. The color filter film 918 may realize a specific color for light which has passed the phosphor layer 917. For example, the color filter film 918 may realize at least one or a combination of red (R), green (G), and blue (B).

The cover film 919 may be formed on the color filter film 918. The cover film 919 may protect the array 200.

Figure 6:
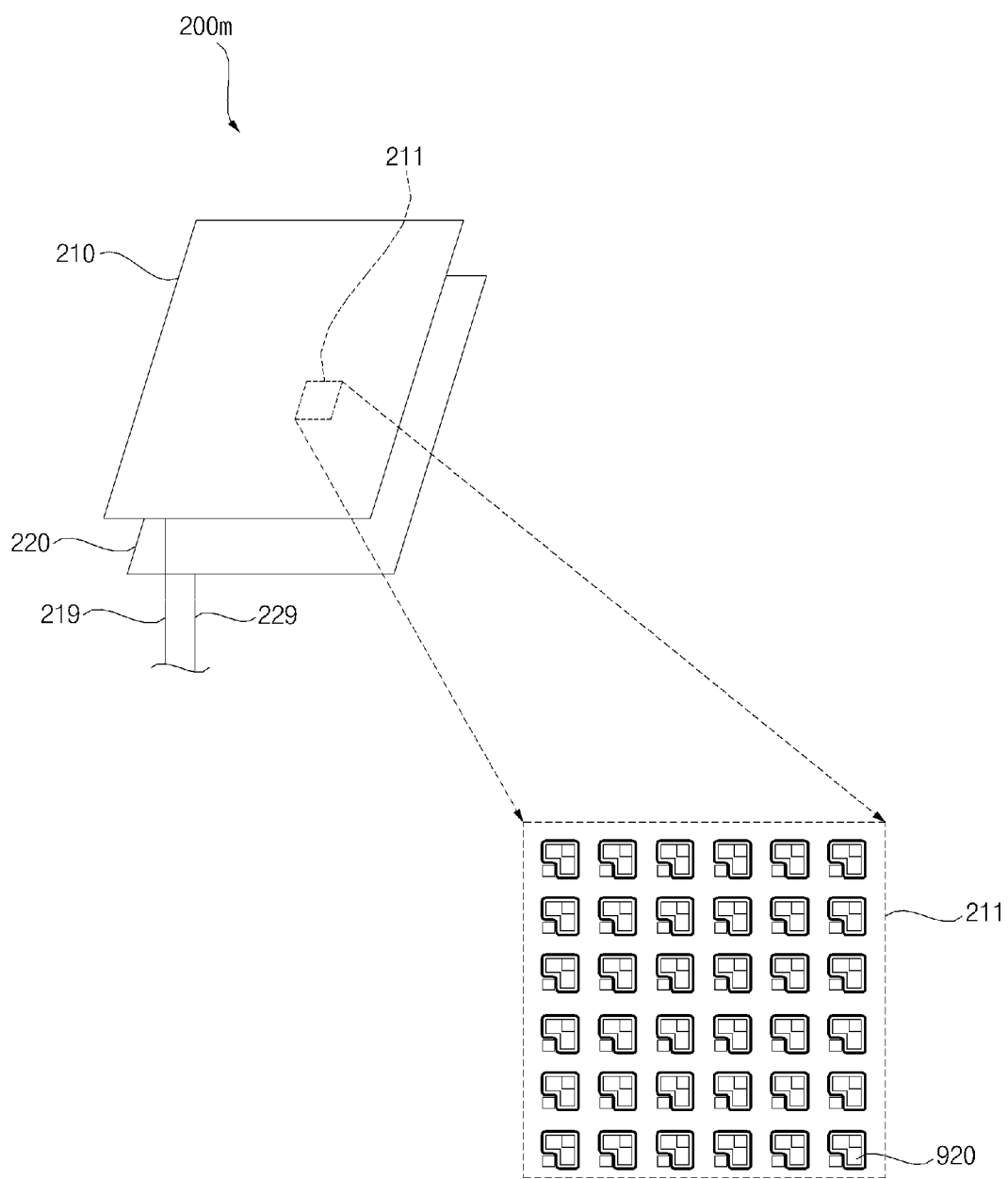
FIG. 6 is a diagram illustrating an example array module.

FIG. 6 is a diagram illustrating an example array module.

Referring to FIG. 6, the light generation unit 160 may include an array module 200*m* including a plurality of arrays.

For example, the light generation unit 160 may include a first array 210 and a second array 220.

The first array 210 may be different from the second array 220 in terms of at least one of: an interval between a plurality of micro LED chips, positions of the plurality of micro LED chips, or a density of the plurality of micro LED chips.

The second array 220 may be different from the first array 210 in terms of at least one of: an interval between a plurality of micro LED chips, positions of the plurality of micro LED chips, or a density of the plurality of micro LED chips.

The density of the plurality of micro LED chips indicates the number of micro LED chips per unit area.

A first group of micro LED chips may be disposed on the first array 210 in a first pattern.

The first pattern may be determined by at least one of the following: an interval between micro LED chips in the first group, positions of the micro LED chips in the first group on an array module, or a density of the micro LED chips in the first group.

A plurality of micro LED chips included in the first array 210 may be disposed at a first interval.

A plurality of micro LED chips included in the first group may be disposed at the first interval.

The second array 220 may be configured such that the plurality of micro LED chips included in the second group is disposed in a second pattern which is different from the first pattern.

The second pattern may be determined by at least one of the following: an interval between the micro LED chips in the second group, positions of the micro LED chips in the second group, or a density of the micro LED chips in the second group.

The plurality of micro LED chips included in the second array 220 may be disposed at an interval as the same as the interval at which the plurality of micro LED chips included in the first array 210 is disposed.

The plurality of micro LED chips included in the second group may be disposed at an interval as the same as the interval at which the plurality of micro LED chips included in the first group is disposed.

That is, the plurality of LED chips included in the second group may be disposed at the first interval.

The plurality of micro LED chips included in the second group may be disposed not to overlap the plurality of micro LED chips included in the first group in a vertical or horizontal direction.

For example, the first group of micro LED chips may be disposed on the first array 210 not to overlap the second group of micro LED chips, when viewed from above with the first array 210 and the second array 220 overlapping each other.

For example, the second group of micro LED may be disposed on the second array 220 not to overlap the first group of micro LED chips, when viewed from above with the second array 220 and the first array 210 overlapping each other.

Due to such arrangement, it is possible to minimize intervention of the micro LED chips belonging to the first group in output power from the micro LED chips belonging to the second group.

In some implementations, the light generation unit 160 may include three or more arrays.

Figure 7A:
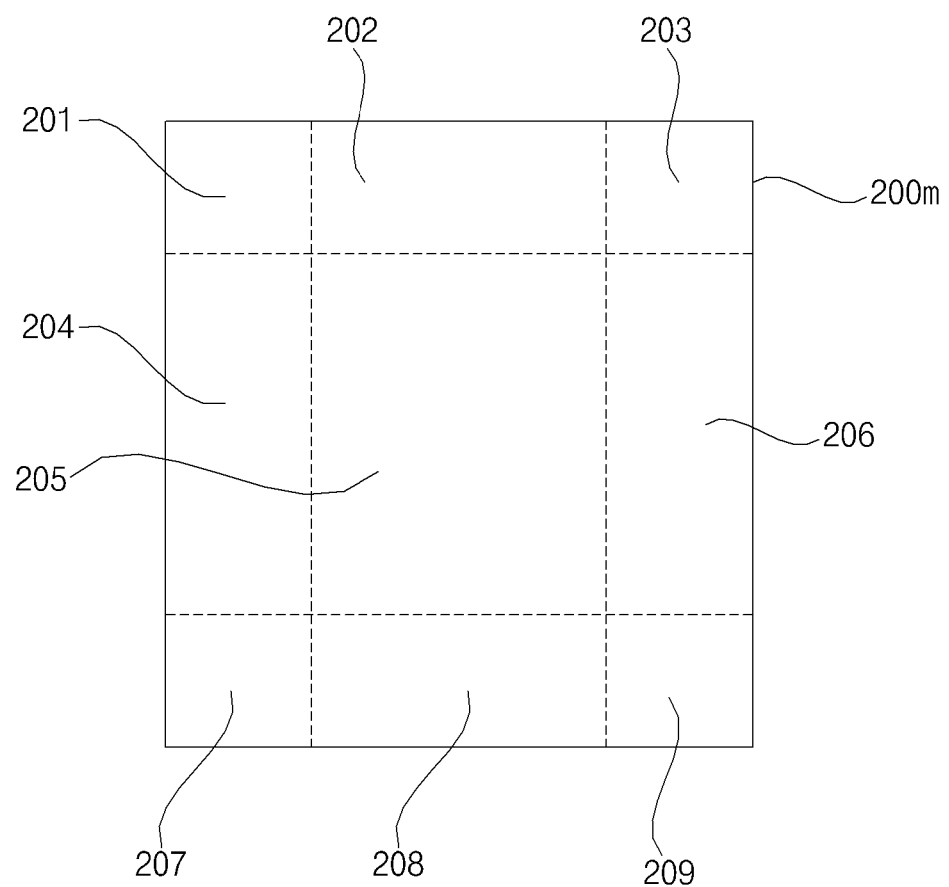
FIG. 7A is an example of a top view of an integrated array module.

FIG. 7A is an example of a top view of an integrated array module.

Figure 7B:
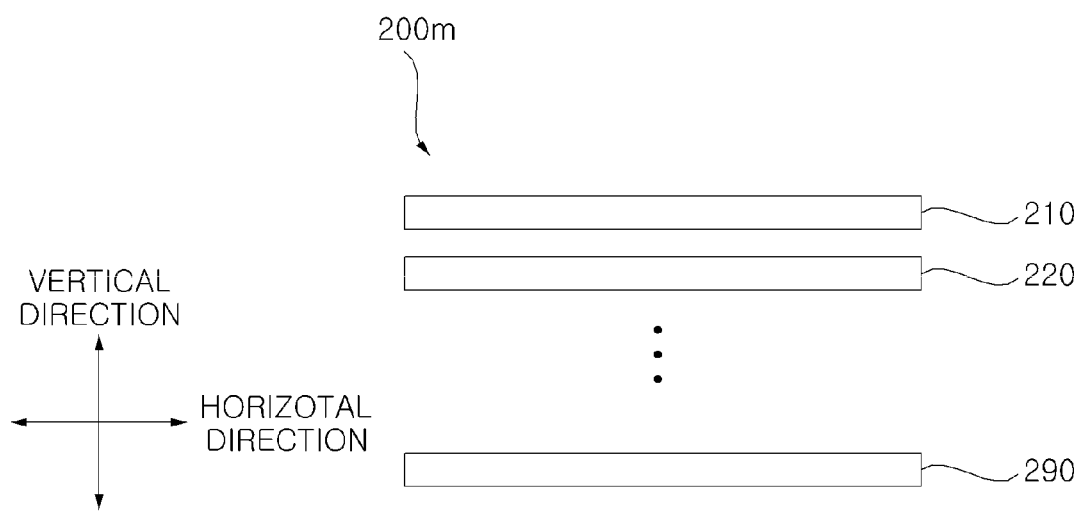
FIG. 7B is an example of a side view of an integrated array module.

FIG. 7B is an example of a side view of an integrated array module.

Referring to FIGS. 7A and 7B, the processor 170 may control the array module 200*m* on the basis of each region (regions 201 to 209).

The processor 170 may adjust a light distribution pattern by controlling the array module 200m on the basis of each region.

The array module 200m may be divided into a plurality of regions 201 to 209.

The processor 270 may adjust an amount of electrical energy to be supplied to each of the plurality of regions 201 to 209.

The processor 170 may control the array module 200m on the basis of each layer.

The processor 270 may adjust an amount of output light by controlling the array module 200m on the basis of each layer.

The array module 200m may be composed of a plurality of layers. The plurality of layers may be composed of a plurality of arrays, respectively.

For example, a first layer of the array module 200m may be formed by a first array, and a second layer of the array module 200m may be formed by a second array.

The processor 270 may adjust an amount of electrical energy to be supplied to each of the plurality of layers.

FIG. 8 is a diagram illustrating an example array module including a plurality of micro LED chips and an example arrangement of the plurality of micro LED chips.

FIG. 8 shows an example in which the array module 200m includes a first array 210 and a second array 220, but the array module 200m may include three or more arrays.

Referring to FIG. 8, the array module 200m may include a polyimide layer 911, the first array 210, and a second array 220.

In some implementations, the array module 200m may further include a phosphor layer 917, a color filter film 918, and a cover film 919 individually or in combination thereof.

The polyimide layer 911 may be flexible.

The second array 220 may be disposed on the base 911.

In some implementations, a layer composed of the polyimide layer 911 or a second anode 912b may be referred to as a base.

In some implementations, the polyimide layer 911 may be referred to as a base.

The second array 220 may be disposed between the first array 210 and the base 911.

The second array 220 may include a second anode 912b, a reflective layer 913, a second inter-layer dielectric film 914b, a second group of micro LED chips 920b, a second optical spacer 916b, and a second cathode 915b.

The second anode 912b may be an FCCL substrate. The second anode 912b may be formed of copper.

The second anode 912b and the second cathode 915b may be light transmissive electrodes.

The second anode 912b and the second cathode 915b may be referred to as transparent electrodes.

The second array 220 may include a transparent electrode.

The second anode 912b and the second cathode 915b may include a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The second anode 912b may be formed between the base 911 and the reflective layer 913.

The second cathode 915b may be formed on the second inter-layer dielectric film 914b.

The reflective layer 913 may be formed on the second anode 912b. The reflective layer 913 may reflect light generated by the plurality of micro LED chips 920. It is desirable that the reflective layer 913 may be formed of silver Ag.

The second inter-layer dielectric film 914b may be formed on the reflective layer 913.

The second group of micro LED chips 920b may be formed on the second anode 912b. Each micro LED chip 920b belonging to the second group may be attached to the reflective layer 913 or the second anode 912b using a solder material or an Anisotropic Conductive Film (ACF).

The second optical spacer 916b may be formed on the second inter-layer dielectric film 914b. The second optical spacer 916b is used to keep the micro LED chips 920b and the first flexible array 210 at a distance from each other, and the second optical spacer 916b may be made of an insulating material.

The first array 210 may be formed on the second array 220.

The first array 210 may include a first anode 912a, a first inter-layer dielectric film 914a, a first group of micro LED chips 920a, a first optical spacer 916a, and a first cathode 915a.

The first anode 912a may be a FCCL substrate. The first anode 912a may be formed of copper.

The first anode 912a and the first cathode 915a may be light transmissive electrodes.

The first anode 912a and the first cathode 915a may be referred to as transparent electrodes.

The first array 210 may include a transparent electrode.

The first anode 912a and the first cathode 915a may include a metal material which is one or a combination of the following: nickel (Ni), platinum (Pt), ruthenium (Ru), iridium (Ir), rhodium (Rh), tantalum (Ta), molybdenum (Mo), titan (Ti), silver (Ag), tungsten (W), copper (Cu), chromium (Cr), palladium (Pd), vanadium (V), cobalt (Co), niobium (Nb), zirconium (Zr), indium tin oxide (ITO), aluminum zinc oxide (AZO) and Indium Zinc Oxide (IZO).

The first anode 912a may be formed between the second optical spacer 916b and the first inter-layer dielectric film 914a.

The first cathode 915a may be formed on the first inter-layer dielectric film 914a.

The first inter-layer dielectric film 914a may be formed on the first anode 912a.

The first group of micro LED chips 920a may be formed on the first anode 912a. Each micro LED chip 920a belonging to the first group may be attached to the first anode 912a using a solder material or an Anisotropic Conductive Film (ACF).

The first optical spacer 916a may be formed on the first inter-layer dielectric film 914a. The first optical spacer 916a is used to keep a distance between the first group of micro LED chips 920a and the phosphor layer 917, and may be formed of an insulating material.

The phosphor layer 910 may be formed on the first array 210 and the second array 220.

The phosphor layer 917 may be formed on the first optical spacer 916a. The phosphor layer 917 may be formed of resin in which a phosphorus is evenly distributed. Depending on a wavelength of light emitted from the micro LED chips 920a and 920b belonging to the first and second groups, any one selected from a blue light-emitting phosphor, a blue-green light-emitting phosphor, a green light-emitting phosphor, a yellow-green light-emitting phosphor, a yellow light-emitting phosphor, a yellow-red light-emitting phosphor, an orange light-emitting phosphor, and a red light-emitting phosphor may be applied as the phosphor.

The phosphor layer 917 may change a wavelength of lights emitted from first and second micro LED chips 920a and 920b.

The phosphor layer 917 may change a wavelength of a first light generated by the first group of micro LED chips 920a, and a wavelength of a second light generated by the second group of micro LED chips 920b.

The color filter film 918 may be formed on the phosphor layer 917. The color filter film 918 may realize a predetermined color for a light which has passed through the phosphor layer 917. The color filter film 918 may realize at least one or a combination of red (R), green (B), and blue (B).

The cover film 919 may be formed on the color filter film 918. The cover film 919 may protect the array module 200m.

In some implementations, the plurality of micro LED chips 920b included in the second array 220 may be disposed not to overlap the plurality of micro LED chips 920a included in the first array 210 in a vertical or horizontal direction.

The plurality of micro LED chips 920b included in the second group may be disposed not to overlap the plurality of micro LED chips 920a included in the first group in a vertical or horizontal direction.

The vertical direction may be a direction in which the array module 200m is deposited.

The first and second groups of micro LED chips 920a and 920b may output light in the vertical direction.

The horizontal direction may be a direction in which the first and second groups of micro LED chips 920a and 920b are arranged.

The horizontal direction may be a direction in which the base 911, the first and second anodes 912a and 912b, or the phosphor layer 917 extends.

In some implementations, the lamp 100 may further include a wire for supplying power to the array module 200m.

For example, the lamp 100 may include a first wire 219 and a second wire 229.

The first wire 219 may supply power to the first array 210. The first wire 219 may be a pair of wires. The first wire 219 may be connected to the first anode 912a and/or the first cathode 915a.

The second wire 229 may supply power to the second array 220. The second wire 229 may be a pair of wires. The second wire 229 may be connected to the second anode 912b and/or the second cathode 915b.

The first wire 219 and the second wire 229 may be disposed not to overlap each other.

As described above with reference to FIGS. 1 to 8, the lamp 100 may include the array module 200m in which a plurality of micro LED chips is arranged.

Figure 9:
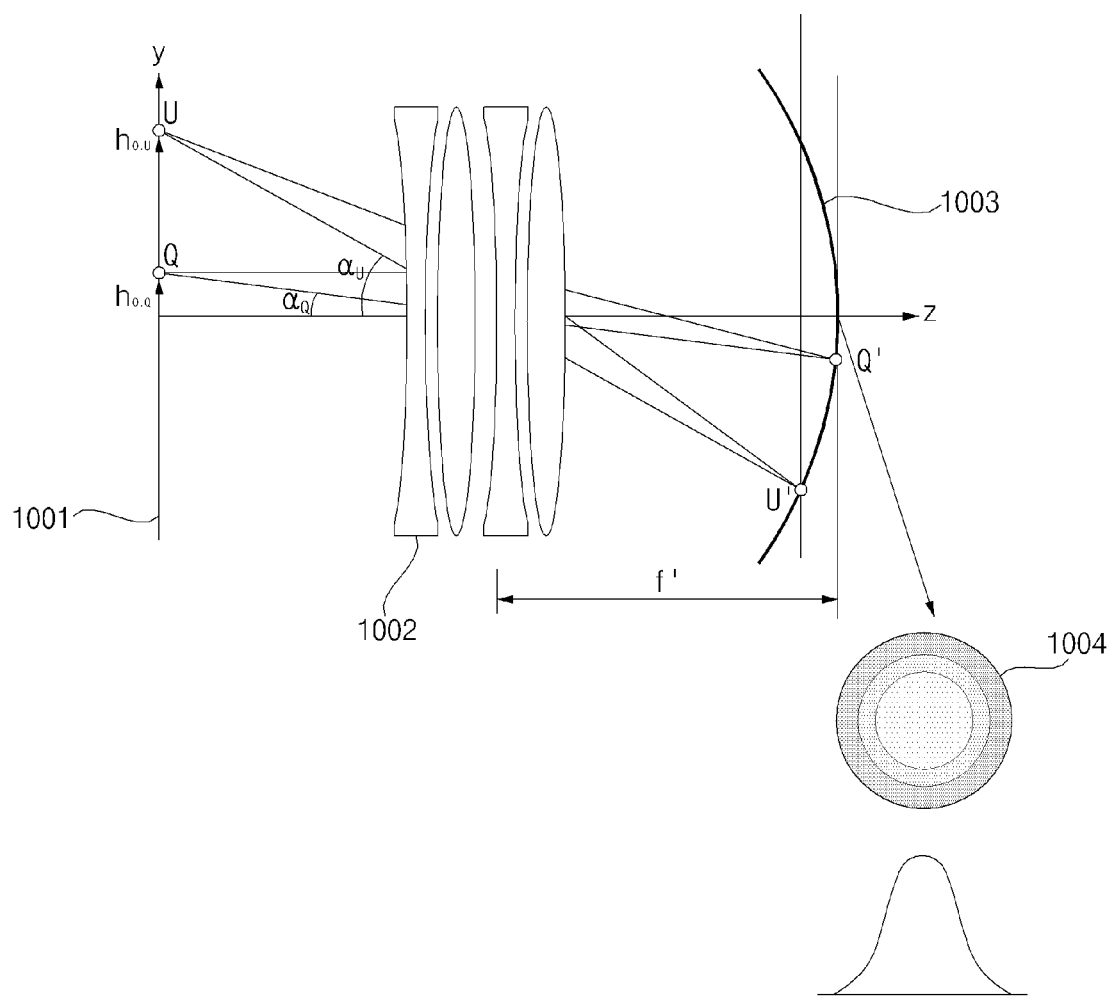
FIG. 9 is a diagram for explaining an example of distribution of light output from an example flat surface light source.

FIG. 9 is a diagram for explaining an example of distribution of light output from an example flat surface light source.

Referring to FIG. 9, a flat surface light source 1001 may output a flat light. When the flat light passes through a lens system 1002, field curvature aberration occurs.

Due to the field curvature aberration, areas having the same amount of light are distinguishable with curvature on a light incidence surface, as shown in the example indicated by the light intensity profile 1004 in FIG. 9.

That is, light is not output uniformly, and a light distribution pattern having the bright center portion and the dark peripheral portion is formed.

Hereinafter, there is described a lamp for a vehicle, which is implemented to prevent the field curvature aberration.

Figure 10:
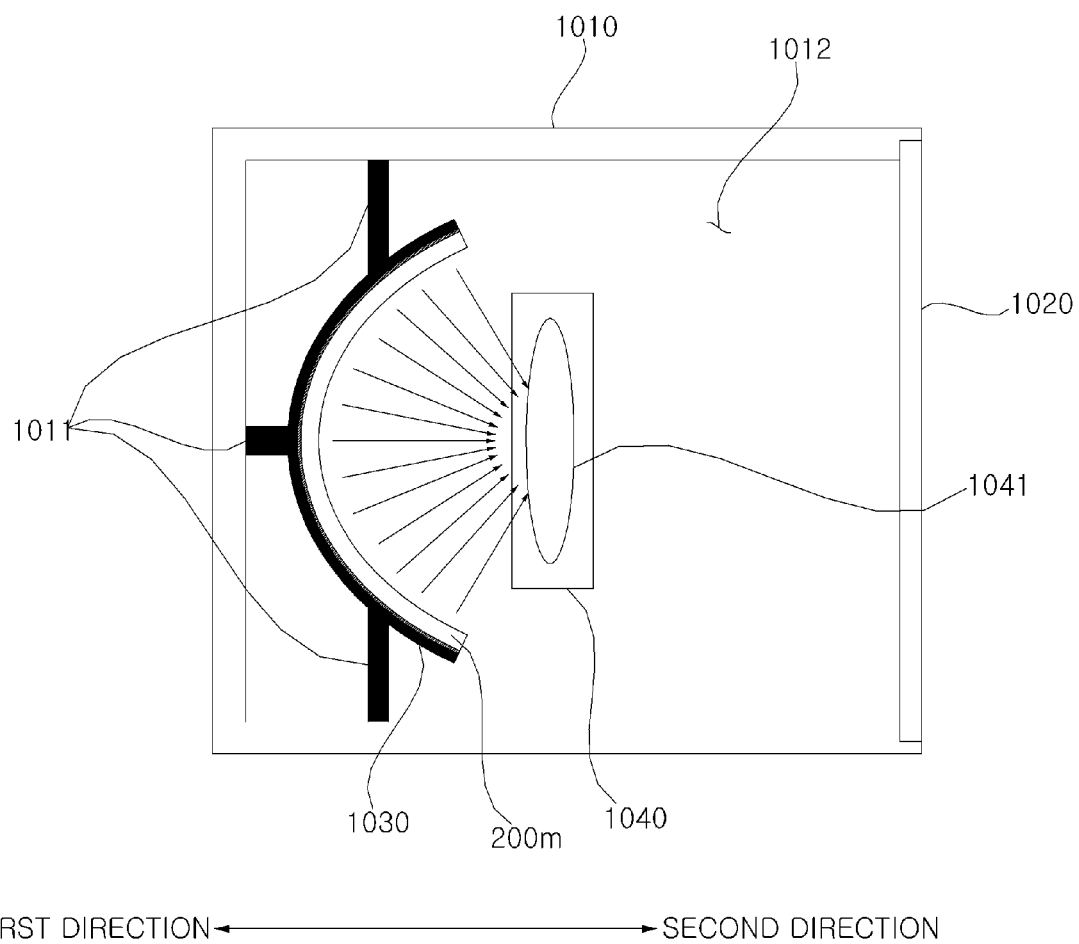
FIG. 10 is a conceptual diagram illustrating an example of a lateral section of a lamp for a vehicle.

FIG. 10 is a conceptual diagram illustrating an example of a lateral section of a lamp for a vehicle.

Figure 11:
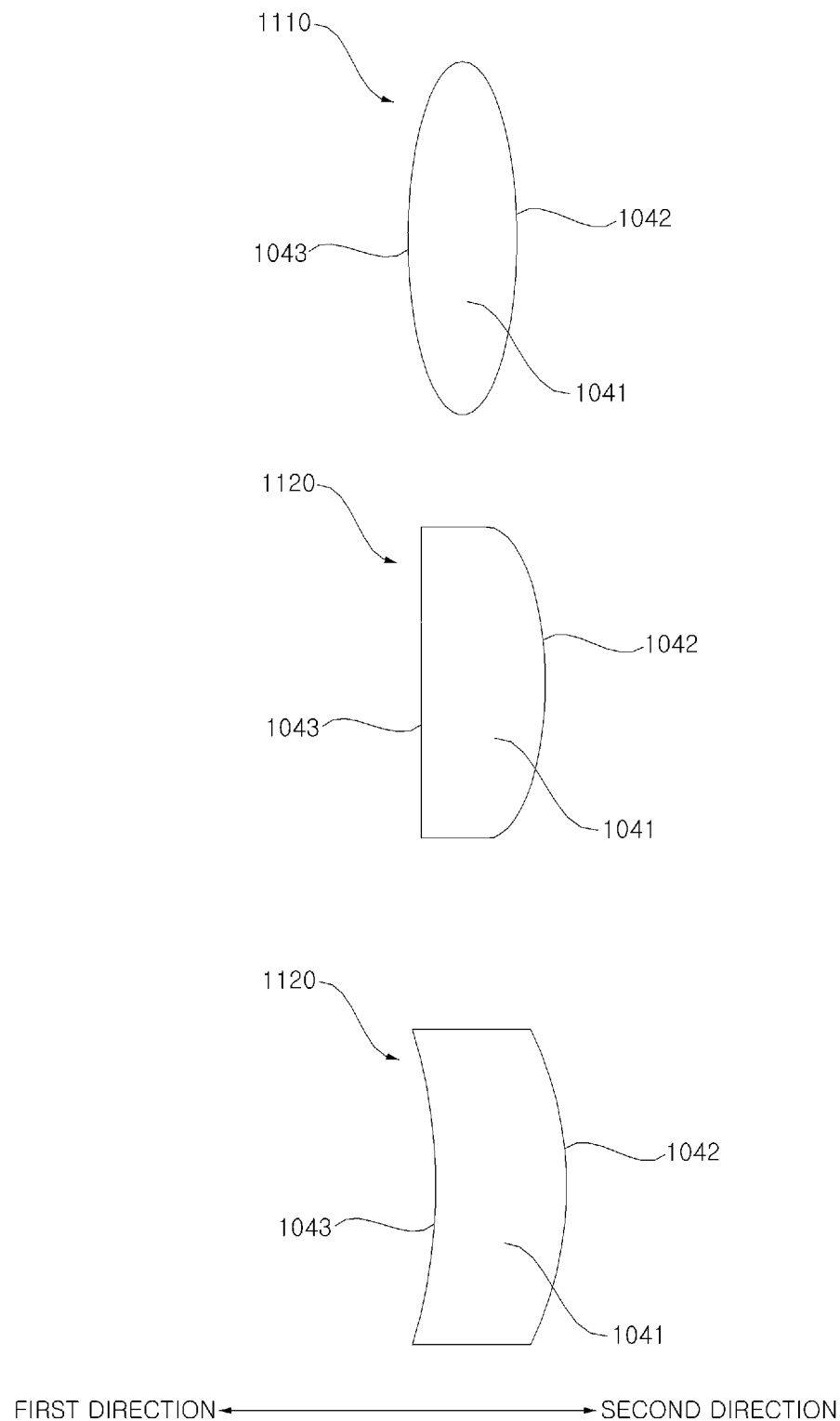
FIG. 11 is a diagram illustrating an example of a lateral section of a lamp for a vehicle.

FIG. 11 is a diagram illustrating an example of a lateral section of a lamp for a vehicle.

Figure 12:
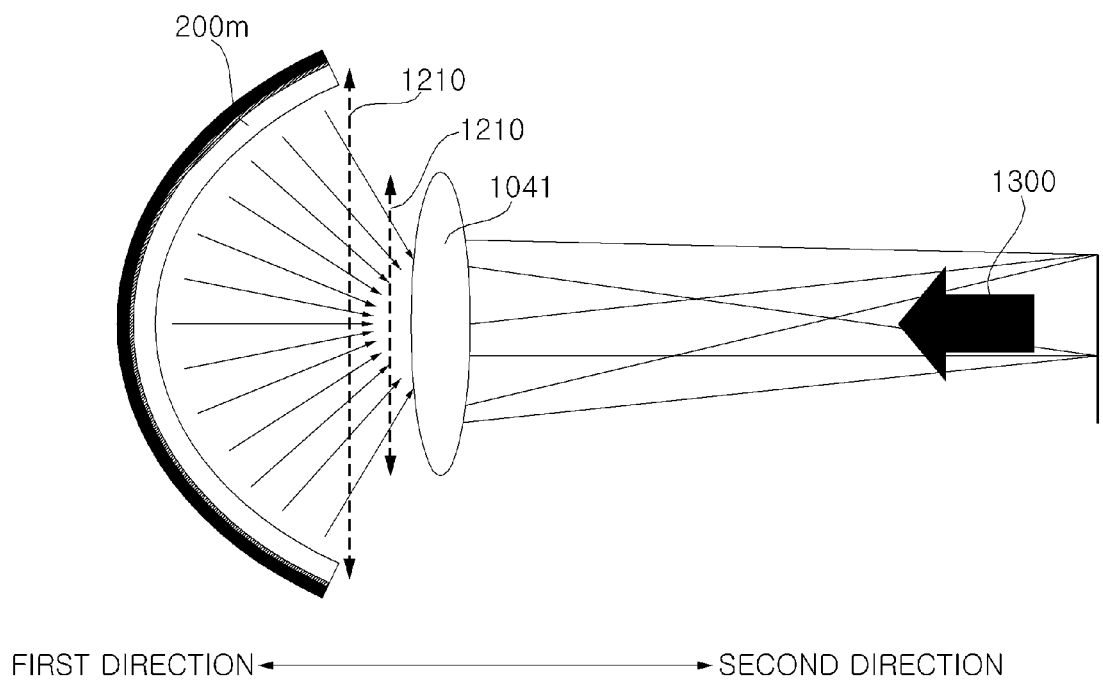
FIG. 12 is a diagram illustrating an example of an array module and a lens system in a lamp for a vehicle.

FIG. 12 is a diagram illustrating examples of an array module and a lens system in a lamp for a vehicle.

FIGS. 10 to 12, a lamp 100 may include an array module 200m, a bracket 1030, and a lens system 1040.

In some implementations, the lamp 100 may further include a housing 1010, a connection structure 1011, and a cover lens 1020.

The housing 1010 may be coupled to the cover lens 1020 and define the outer appearance of the lamp 100.

The housing 1010 may be coupled to the cover lens 1020 and define an inner space 1012.

For example, part of the housing 1010 may be open and the cover lens 1020 may cover the open part of the housing 1010 and define the inner space 1012.

In the inner space 1012, the array module 200m, the bracket 1030, and the lens system 1040 may be disposed.

With being connected to the housing 1010, the connection structure 1011 may support at least one of the array module 200m or the bracket 1030.

The cover lens 1020 may be coupled to the housing 1010 and define the outer appearance of the lamp 100.

The cover lens 1020 may be coupled to the housing 1010 and define the inner space 1012.

The cover lens 1020 may define the outer appearance of a vehicle 10, together with other components of the vehicle 10.

The cover lens 1020 may be formed of a transparent material.

For example, the cover lens 1020 may be formed of a transparent synthetic resin material or a glass material.

The cover lens 1020 may be referred to as an outer lens.

Descriptions provided with reference to FIGS. 1 to 8 may be applied to the array module 200m.

The array module 200m may output light to ensure visibility for a driver.

The array module 200m may have a shape concave in a first direction.

The array module 200m may have a 3D shape concave in the first direction. For example, the 3D shape may be a parabolic shape.

For example, the array module 200m may have a parabolic shape concave in the first direction.

For example, when the lamp 100 functions as a head lamp, the first direction may be a direction in which the vehicle 10 travels backward.

For example, the first direction may be a direction toward the inside of the vehicle 10 from the lamp 100.

The array module 200m may be bonded to the bracket 1030 using an adhesive member.

For example, the array module 200m may be bonded to the bracket 1030 using a double-sided tape.

In some implementations, the array module 200m may output light to implement a head lamp.

Detailed description about the shape of the array module 200m will be described below with reference to FIG. 13 and other following drawings.

The array module 200m may be bonded to one concave surface of the bracket 1030.

The bracket 1030 may support the array module 200m.

The bracket 1030 may have a shape concave in the first direction.

The bracket 1030 may have a parabolic shape concave in a first direction.

For example, when the lamp 100 functions as a head lamp, the first direction may be a direction in which the vehicle 10 travels backward.

For example, the first direction may be a direction toward the inside of the vehicle 10 from the lamp 100.

The bracket 1030 may be fixed to the housing 1010 using the connection structure 1011.

The lens system 1040 may change an optical path of a light generated in the array module 200*m*.

The lens system 1040 may have an optical power of a convex nature.

The lens system 1040 may include at least one lens 1041.

The lens 1041 may change an optical path of a light generated in the array module 200*m*.

As illustrated in FIG. 11, at least one surface of the lens 1041 may be convex.

As illustrated in an example 1110, both surfaces of the lens 1041 may be convex.

As illustrated in the example 1120, one surface of the lens 1041 may be convex and the other surface may be flat.

As illustrated in the example 1120, one surface of the lens 1041 may be convex, and the other surface may be concave.

An optical power of the whole lens 1041 may have a convex nature.

The optical power of the lens 1041 may have a positive value (+).

The lens 1041 may be disposed in a second direction relative to the array module 200*m*.

The second direction may be defined as a direction opposite to the first direction.

For example, when the lamp 100 functions as a head lamp, the second direction may be a direction in which the vehicle 10 travels straight forward.

For example, the second direction may be a direction toward the outside of the vehicle 10 from the lamp 100.

The lens 1041 may be disposed between the array module 200*m* and the cover lens 1020.

As illustrated in FIG. 12, a section length 1210 of the lens 1041 may be smaller than a section length of the array module 200*m*.

As the array module 200*m* is concave in the first direction, lights generated by the array module 200*m* may converge. Accordingly, the section length 1210 of the lens 1041 is smaller than the section length of the array module 200*m*, and therefore, the lamp 100 may be compacted.

The lights generated by the array module 200*m* may converge toward the lens 1041.

In some implementations, the lamp 100 may further include a heat dissipation part.

The heat dissipation part may discharge heat generated in the array module 200*m* to be discharged to the outside of the lamp 100.

Figure 13:
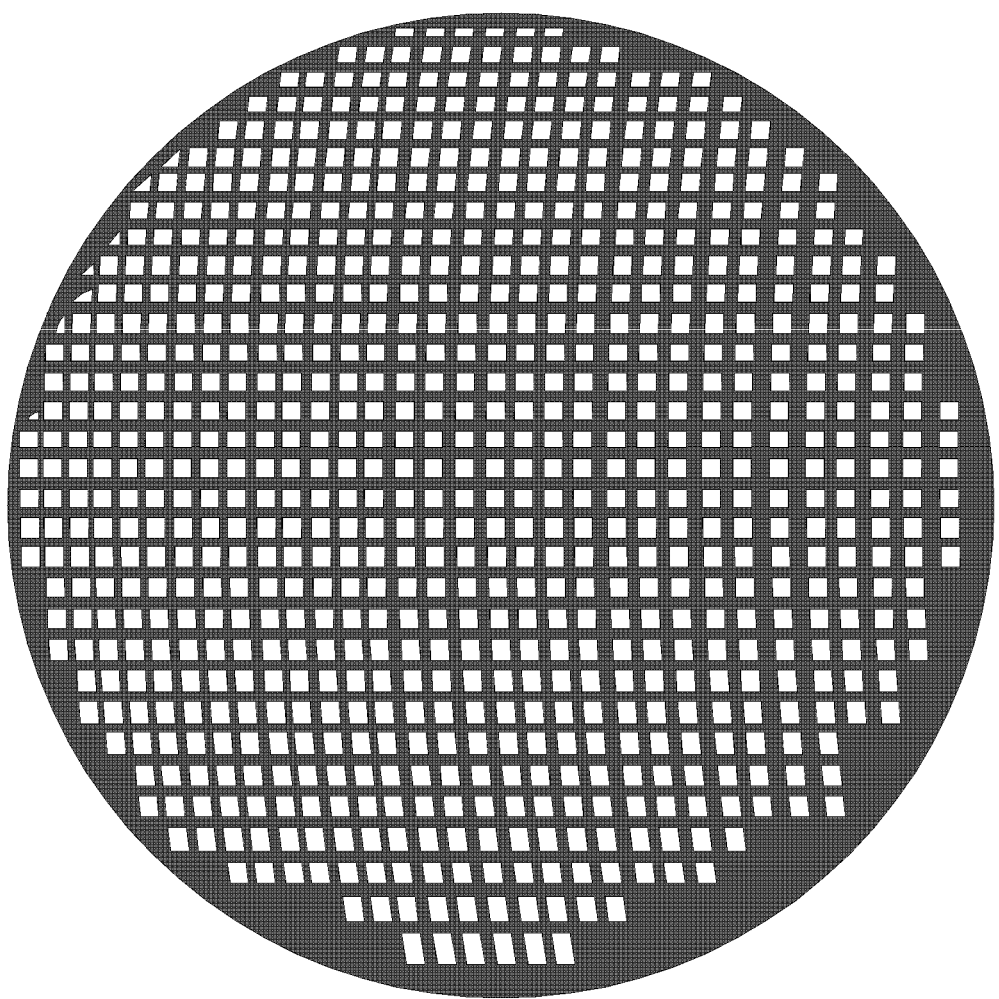
FIG. 13 shows an example of an array module that is seen from a direction in which light is incident, where the array module include a plurality of subarray modules coupled to one another.

FIG. 13 shows an example of an array module that is seen from a direction in which light is incident, where a plurality of subarray modules is coupled to one another.

FIG. 13 shows an example of the array module 200*m* seen from a direction indicated by an arrow 1300 of FIG. 12.

Figure 14:
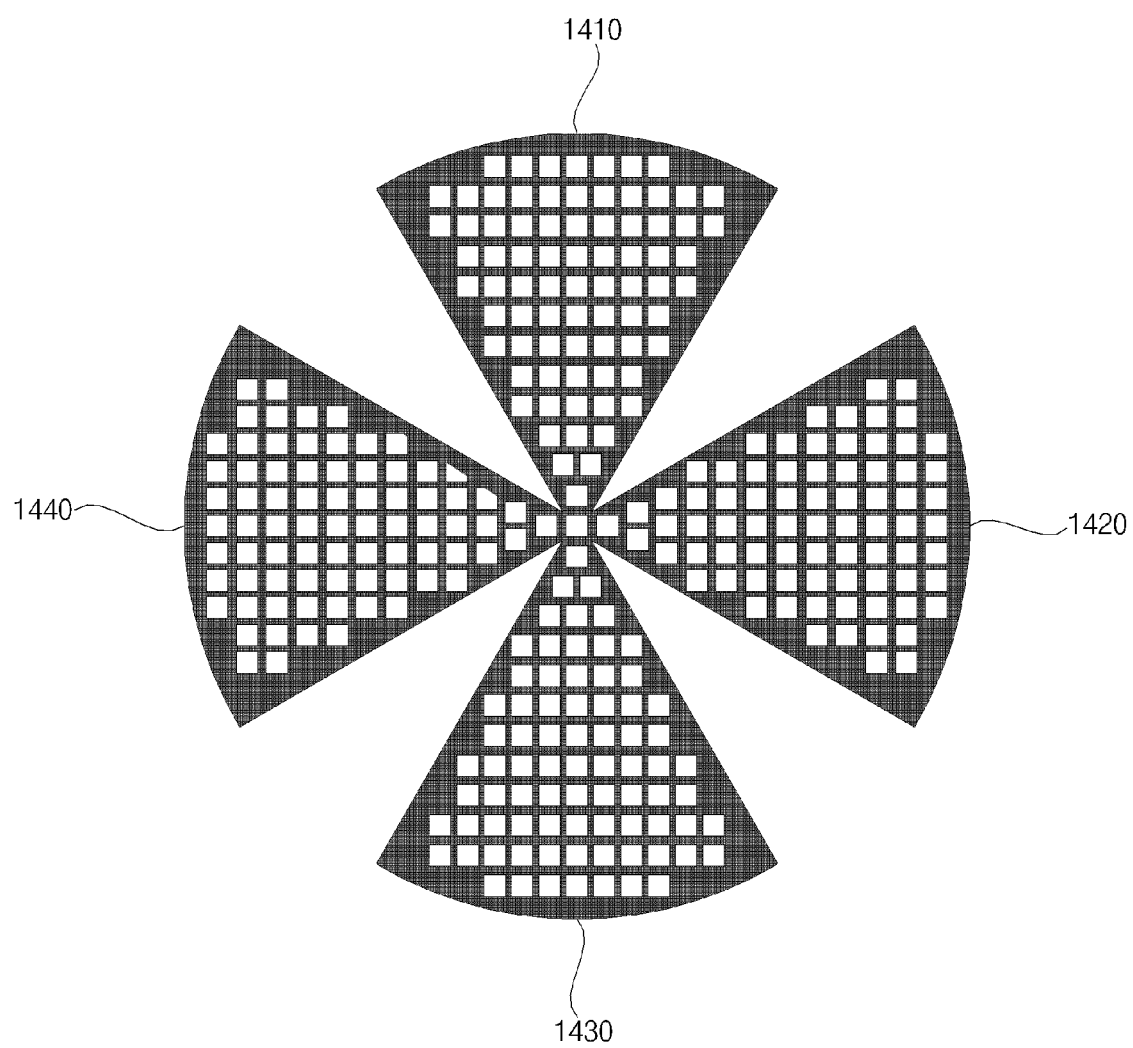
FIG. 14 shows an example of an array module that is in a developed state before a plurality of subarray modules is coupled to one another.

FIG. 14 shows an example of an array module that is in a developed state before a plurality of subarray modules is coupled to one another.

Referring to FIGS. 13 and 14, when a plurality of subarray modules 1410, 1420, 1430, and 1440 is developed, the array module 200*m* may have a roughly round shape or an oval shape such that the plurality of subarray modules 1410, 1420, 1430, and 1440 are formed at an interval therebetween.

The array module 200*m* may include the plurality of subarray modules 1410, 1420, 1430, and 1440.

A plurality of micro LED chips 920 may be disposed in each of the plurality of subarray modules 1410, 1420, 1430, and 1440.

FIG. 14 shows an example in which the array module 200*m* includes four subarray modules 1410, 1420, 1430, and 1440, but there is no limitation in the number of subarray modules.

Before the plurality of subarray modules 1410, 1420, 1430, and 1440 is coupled to one another, an interval between the plurality of subarray modules 1410, 1420, 1430, and 1440 may gradually increase in a direction from a center to a periphery.

For example, in the case where each vertex of the plurality of subarray modules 1410, 1420, 1430, and 1440 contacts one another before the plurality of subarray modules 1410, 1420, 1430, and 1440 is coupled to one another, an interval between the plurality of subarray modules 1410, 1420, 1430, and 1440 may gradually increase as distance to the vertices increases.

For example, when the plurality of subarray modules 1410, 1420, 1430, and 1440 is developed, an interval between the plurality of subarray modules 1410, 1420, 1430, and 1440 may gradually increase in a direction from a center to a periphery.

In some implementations, as illustrated in FIG. 14, the array module 200*m* in a developed state may be bonded to a parabolic bracket 1030 by an adhesive member. In this case, the plurality of subarray modules 1410, 1420, 1430, and 1440 may be coupled to one another, and therefore, the array module 200*m* may take a parabolic shape, as illustrated in FIG. 13.

Figure 15:
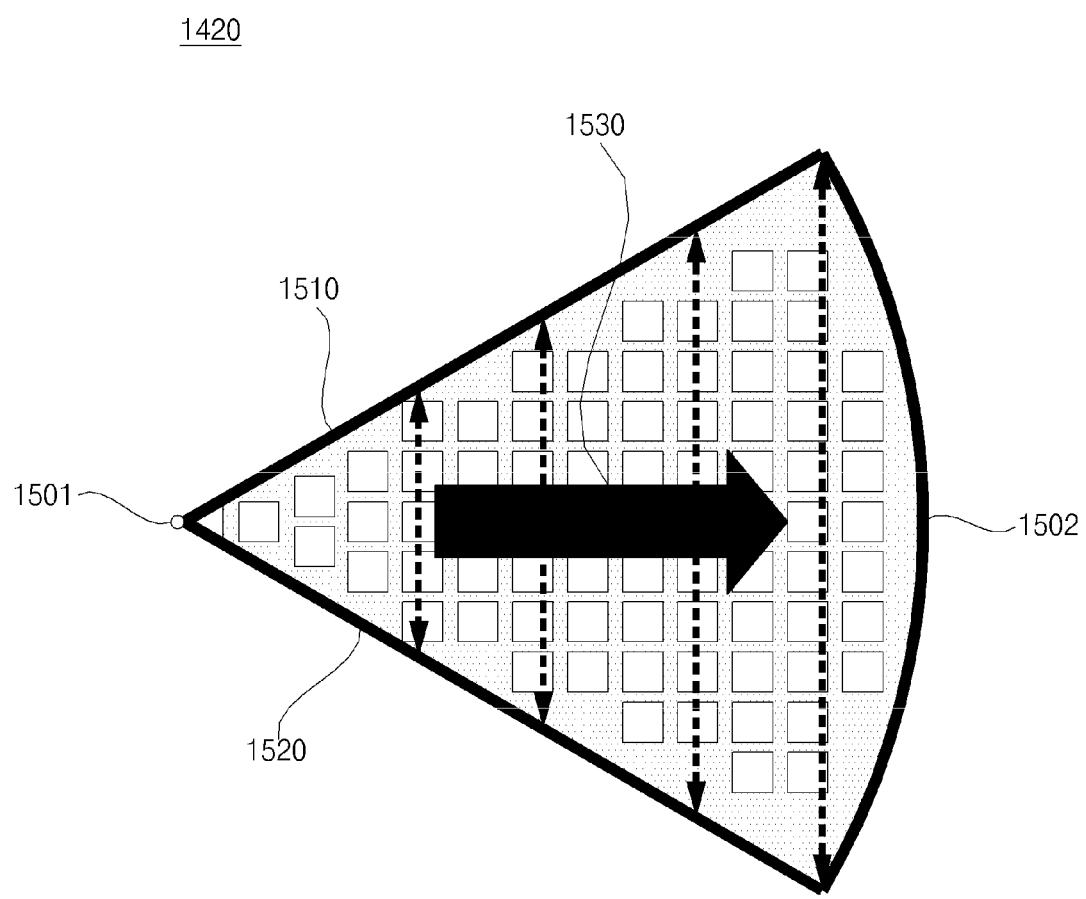
FIGS. 15 and 16 are diagrams for explaining an example subarray module.
Figure 16:
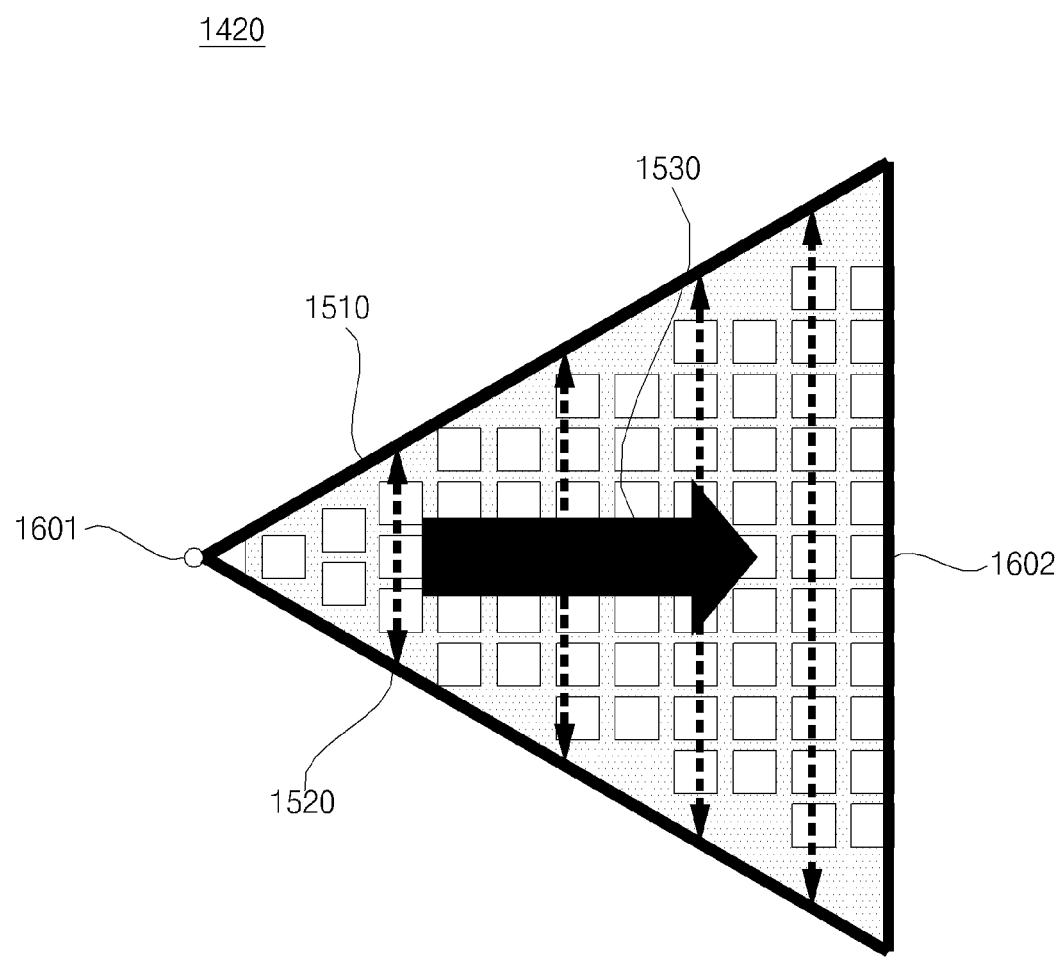

FIGS. 15 and 16 are diagrams for explaining a subarray module.

Referring to FIGS. 15 and 16, with being coupled to one another, each of the plurality of subarray modules 1410, 1420, 1430, and 1440 may have a shape required to maintain the aforementioned parabolic shape.

Before the plurality of subarray modules 1410, 1420, 1430, and 1440 is coupled to one another, at least one region in each of the plurality of subarray modules 1410, 1420, 1430, and 1440 may gradually increase in width in a direction from a center 1501 to a periphery 1502.

For example, when the array module 200*m* is developed into one plane, at least one region in each of the plurality of subarray modules 1410, 1420, 1430, and 1440 may gradually increase in width in a direction 1530 from the center 1501 to the periphery 1502.

Before the plurality of subarray modules 1410, 1420, 1430, and 1440 is coupled to one another, the plurality of subarray modules 1410, 1420, 1430, and 1440 may include a first side 1510 extending from the center 1501 toward the periphery 1502, and a second side 1520 meeting the first side 1510 and extending from the center 1501 toward the periphery 1502.

For example, when the array module 200*m* is developed into one plane, each of the plurality of subarray modules 1410, 1420, 1430, and 1440 may include the first side 1510 extending from the center 1501 toward the periphery 1502, and the second side 1520 meeting the first side 1510 and extending from the center 1501 toward the periphery 1502. In this case, the first side 1510 and the second side 1520 may form a predetermined angle.

As illustrated in FIG. 15, when the array module 200*m* is developed into one plane, each of the plurality of subarray modules 1410, 1420, 1430, and 1440 may have a fan shape.

As illustrated in FIG. 16, when the array module 200*m* is developed into one plane, each of the plurality of subarray modules 1410, 1420, 1430, and 1440 may have a triangular shape.

In some implementations, the center 1501 may be defined as the vertex of a fan-shaped subarray module 1420 shown in FIG. 15. In addition, the periphery 1502 may be defined as the arc of the fan-shaped subarray module 1420 shown in FIG. 15.

In some implementations, a center 1601 may be defined as the vertex of a triangular-shaped subarray module 1420 shown in FIG. 16. In addition, a periphery 1602 may be defined as the arc of the triangular-shaped subarray module 1420 shown in FIG. 16.

Referring to FIGS. 14 and 15, each of the plurality of subarray modules 1410, 1420, 1430, and 1440 may have a fan shape.

Before the plurality of subarray modules 1410, 1420, 1430, and 1440 is coupled to one another, an interval between the plurality of subarray modules 1410, 1420, 1430, and 1440 may gradually increase in a direction from the center 1501 toward the arc 1502 of the fan shape.

For example, when the array module 200*m* is developed into one plane, an interval between the plurality of subarray modules 1410, 1420, 1430, and 1440 may gradually increase in a direction from the center 1501 toward the arc 1502 of the fan shape.

Figure 17:
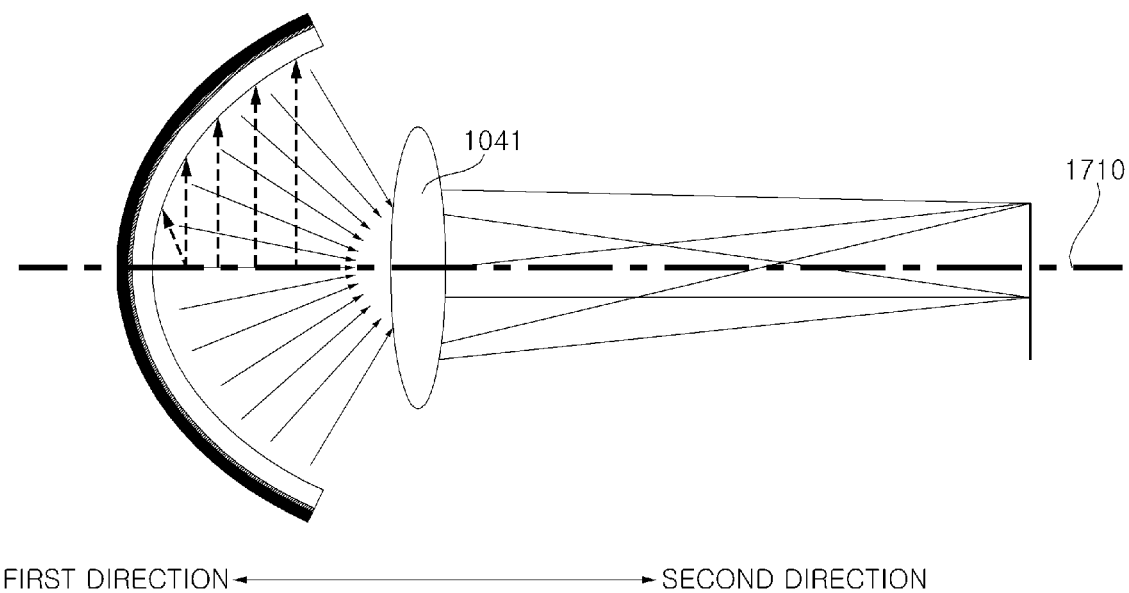
FIG. 17 illustrates an example of a lateral section of a plurality of subarray modules that are coupled to one another and that define a three-dimensional (3D) shape.

FIG. 17 illustrates an example of a lateral section of a plurality of subarray modules being coupled to one another to form a 3D shape.

The array module 200*m* may be configured such that, when the plurality of subarray modules 1410, 1420, 1430, and 1440 is coupled to one another, a periphery of each of the plurality of subarray modules 1410, 1420, 1430, and 1440 may be distal from an optical axis 1710 of a lens 1041 than a center thereof.

For example, when the array module 200*m* is in a 3D shape, a periphery of each of the plurality of subarray modules 1410, 1420, 1430, and 1440 may is distal from the optical axis 1710 of the lens 1041 than a center thereof.

For example, when the plurality of subarray modules 1410, 1420, 1430, and 1440 is coupled to one another and thus has a parabolic shape, a periphery of each of the plurality of subarray modules 1410, 1420, 1430, and 1440 may is distal from the optical axis 1710 of the lens 1041 than a center thereof.

The array modules 200*m* may be configured such that each of the plurality of subarray modules 1410, 1420, 1430, and 1440 is bent after the plurality of subarray modules 1410, 1420, 1430, and 1440 are coupled to one another.

For example, when the array module 200*m* is in a 3D shape, each of the plurality of subarray modules 1410, 1420, 1430, and 1440 may be bent.

For example, when the plurality of subarray modules 1410, 1420, 1430, and 1440 is coupled to one another to take a parabolic shape, each of the plurality of subarray modules 1410, 1420, 1430, and 1440 may be bent.

In some implementations, the optical axis 1710 of the lens 1041 may penetrate the center of the parabolic array module 200*m*.

Figure 18:
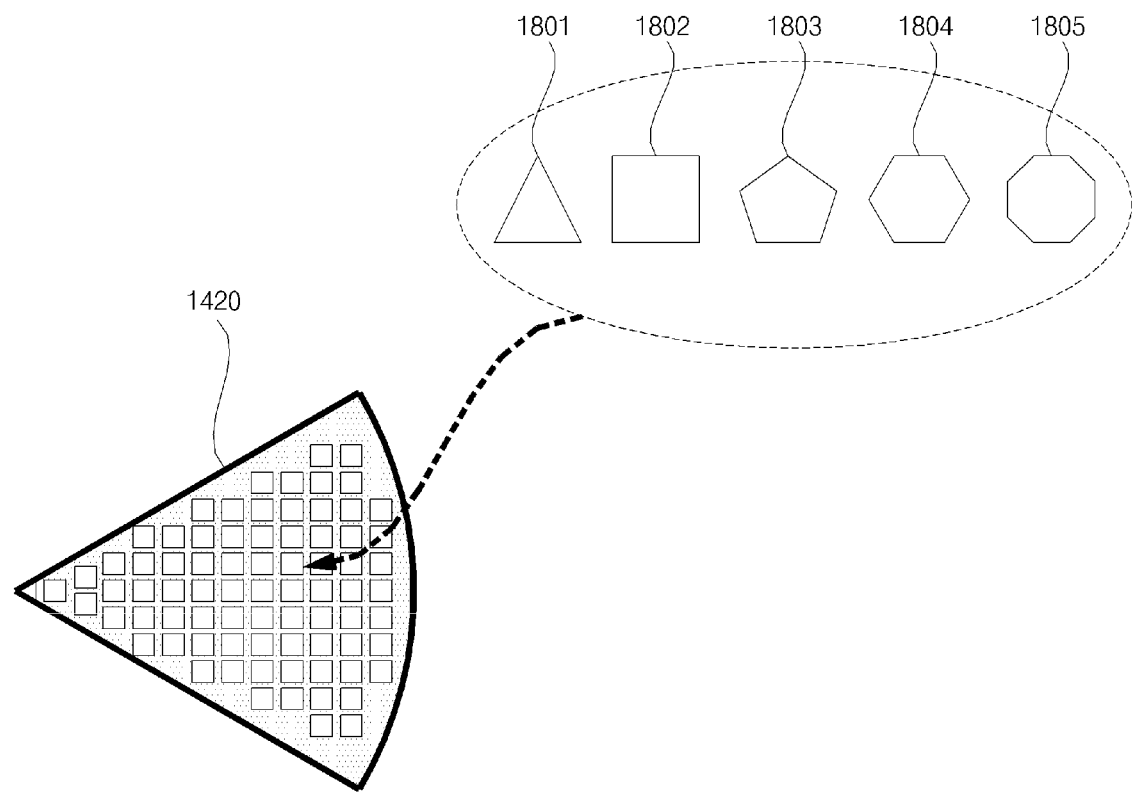
FIG. 18 is a diagram for explaining an example unit array.

FIG. 18 is a diagram for explaining an example unit array.

The plurality of subarray modules 1410, 1420, 1430, and 1440 may include a plurality of unit arrays.

On a unit array, a plurality of micro LED chips 920 may be disposed.

The unit array may have a polygonal shape.

For example, the unit array may have at least one shape of a triangle 1801, a rectangle 1802, a pentagon 1803, a hexagon 1804, and an octagon 1805.

Figure 19A:
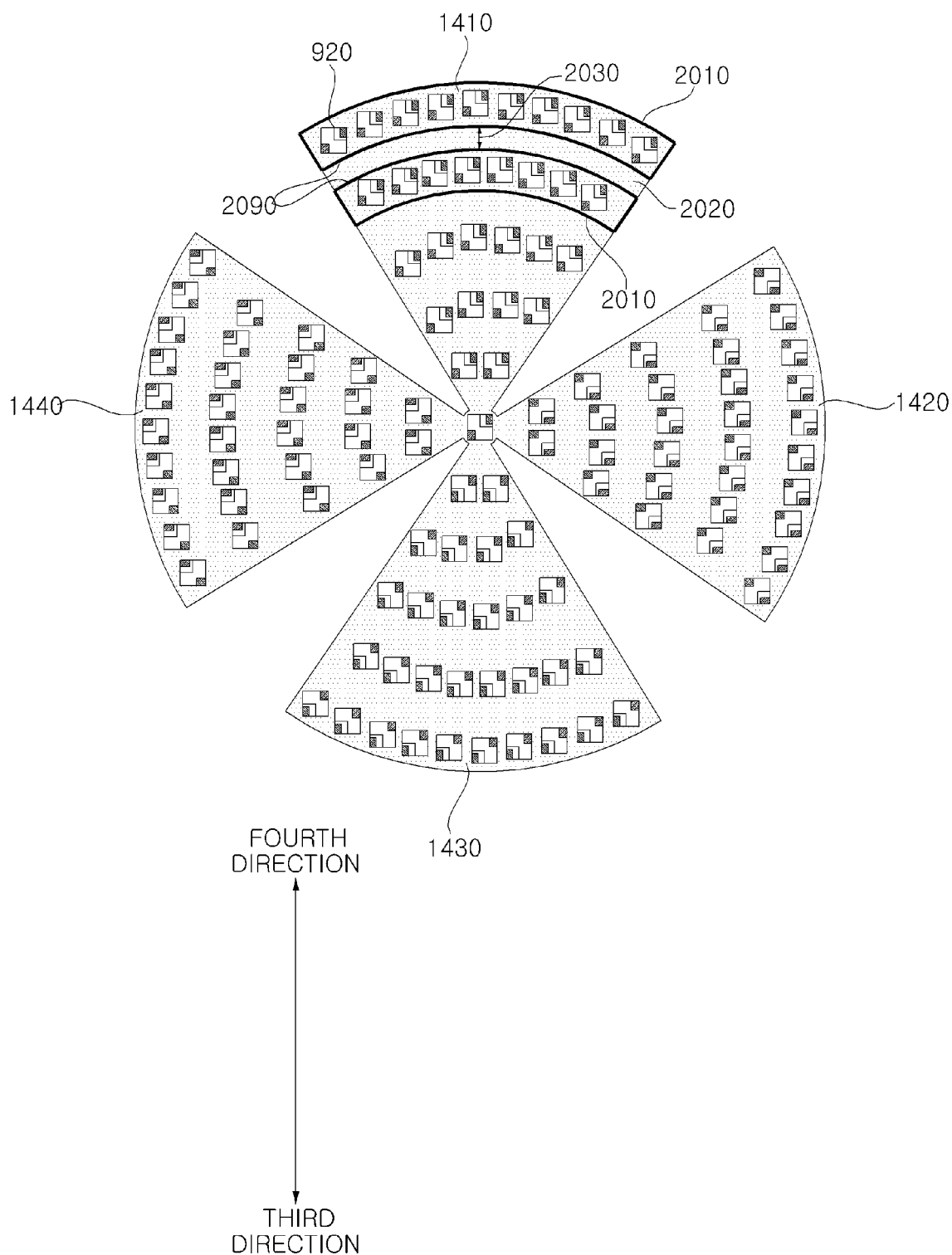
FIGS. 19A and 19B are diagrams for explaining examples of a lamp for a vehicle.
Figure 19B:
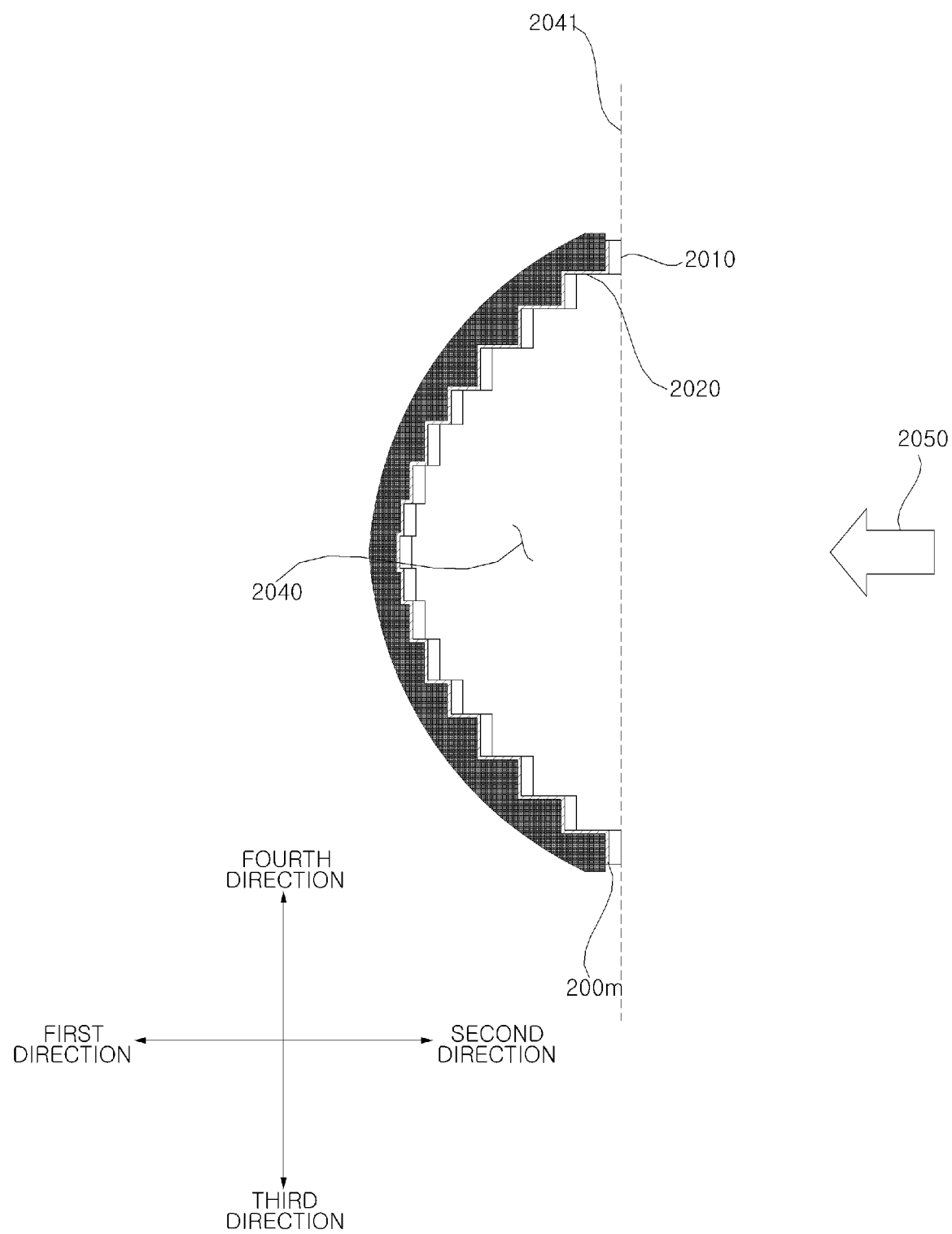

FIGS. 19A and 19B are diagrams for explaining a lamp for a vehicle.

FIG. 19A shows an example of an array module developed into one plane.

FIG. 19B shows an example of a lateral section of an array module in a 3D shape.

Referring to FIGS. 19A and 19B, the array module 200*m* may be formed to be stepped.

For example, the array module 200*m* in a 3D shape may be formed to be stepped in a direction different from a first direction.

For example, the array module 200*m* in a 3D shape may be formed to be stepped in a third direction or a fourth direction which is at a predetermined angle relative to the first direction.

For example, the array module 200*m* in a 3D shape may be formed to be stepped in an upward-downward direction.

AS being formed to be stepped, the array module 200*m* may have a stair-shaped lateral section. In this case, the array module 200*m* may be in a structure which is horizontally symmetric.

The array module 200*m* may include a plurality of first regions 2010 and a plurality of second regions 2020.

A first region 2010 may be defined as a region directed toward the second direction.

The second direction may be defined as a direction opposite to the first direction.

For example, when the lamp 100 functions as a head lamp, the second direction may be a direction of forward travel of a vehicle.

For example, the second direction may be a direction of the lamp 100 directed toward the outside of the vehicle 10.

The second region 2020 may be defined as a region directed toward the third direction or the fourth direction.

The third direction may be defined as a direction perpendicular to the first direction and the second direction.

For example, the third direction may be a direction toward the ground.

The fourth direction may be defined as a direction opposite to the third direction.

For example, the fourth direction may be a direction toward the sky.

A second region 2020 may be defined as a region which is directed toward at least one portion of the array module 200*m* while the array module 200*m* is in a 3D shape.

The plurality of micro LED chips 920 may be disposed in the first region 2010.

The plurality of micro LED chips 920 may not be disposed in the second region 2020.

In this case, as illustrated in FIG. 19A, where the array module 200*m* is developed into one plane, the plurality of micro LED chips 920 may be disposed at an interval 2030 in a direction from the periphery to the center.

In some implementations, a surface of the bracket 1030 facing the array module 200*m* may be formed to be stepped.

For example, the surface of the bracket 1030 facing the array module 200*m* may be formed to be stepped in a direction different from the first direction.

For example, the surface of the bracket 1030 facing the array module 200*m* may be formed to be stepped in the third direction or the fourth direction which is at a predetermined angle relative to the first direction.

For example, the surface of the bracket 1030 facing the array module 200m may be formed to be stepped in an upward-downward direction.

The surface of the bracket 1030 facing the array module 200m may have a stair-shaped lateral section.

The bracket 1030 may be in a structure which is horizontally symmetric.

In some implementations, as a flexible array module 200m is bonded to the bracket 1030, the array module 200m is able to have the shape described above with reference to FIGS. 19A and 19B.

As illustrated in FIG. 19A, the array module 200m may include the plurality of subarray modules 1410, 1420, 1430, and 1440.

The description described above with reference to FIGS. 14 to 18 may be applied to the plurality of subarray modules 1410, 1420, 1430, and 1440.

The array module 200m may have a bending portion 2090.

The bending portion 2090 may make the first regions 2010 and the second regions 2020 distinguishable.

The bending portion 2090 of the array module 200m may be understood as a portion which contacts an edge formed by a surface of the bracket 1030 directed in the second direction and a surface of the bracket 1030 directed toward the third direction when the array module 200m is bonded to the bracket 1030.

The bending portion 2090 of the array module 200m may be understood as a portion which contacts an edge formed by a surface of the bracket 1030 directed toward the second direction and a surface of the bracket 1030 directed toward the fourth direction when the array module 200m is bonded to the bracket 1030.

The plurality of micro LED chips 920 may not be disposed in the bending portion 2090.

Figure 20:
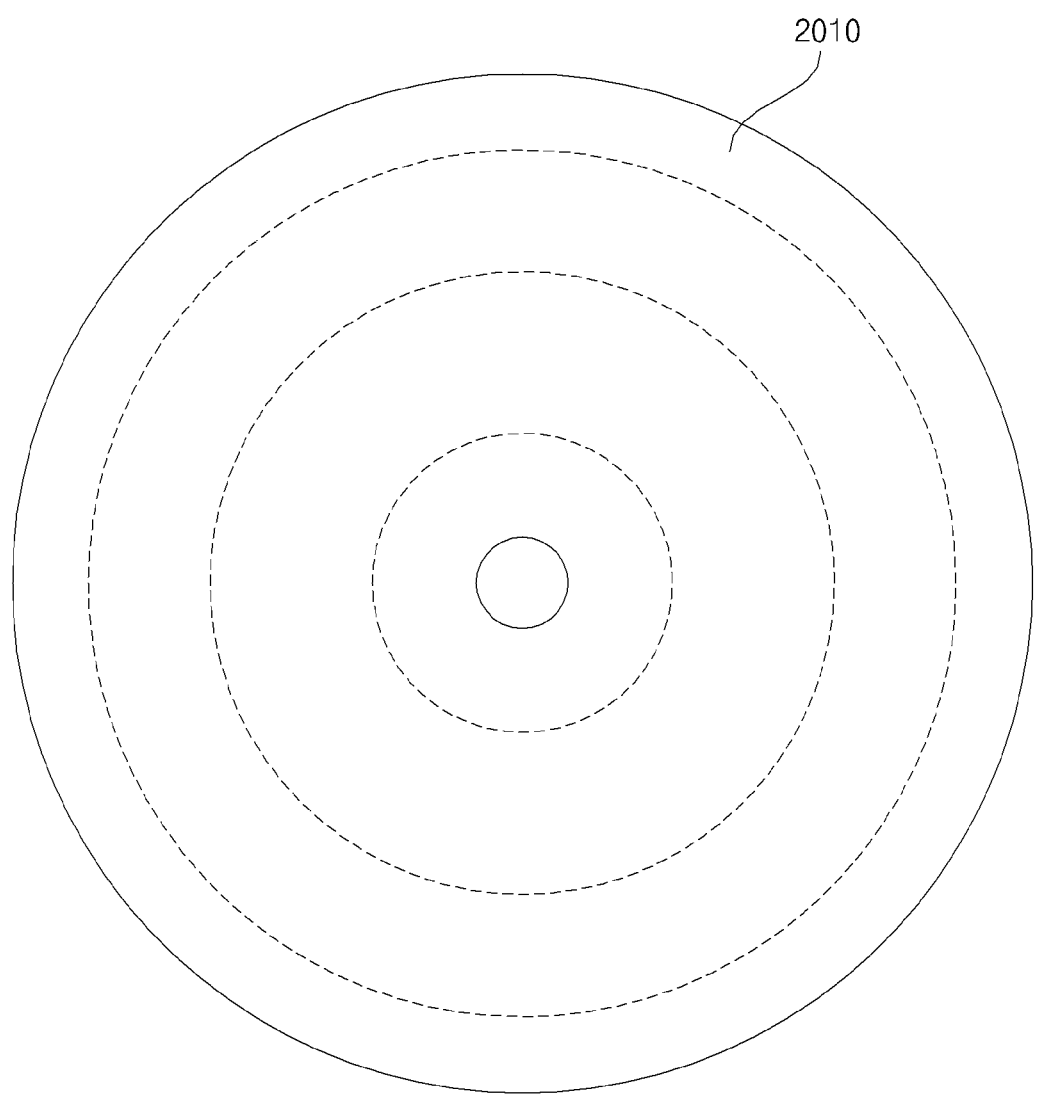
FIG. 20 shows an example of a front view of an array module in a 3D shape.

FIG. 20 shows an example of a front view of an example array module in a 3D shape.

FIG. 20 shows an example of the array module 200m seen from a point from which light is incident.

FIG. 20 shows an example of the array module 200m seen from a direction of an arrow 2050 shown in FIG. 19B.

Referring to FIG. 20, any one of the first regions 2010 may have a donut-shaped vertical section cut along the first direction.

When the array module 200m has a stepped parabolic shape, one of the first regions 2010 directed toward the second directions may have a donut-shaped vertical section which is cut along the first direction.

Figure 21:
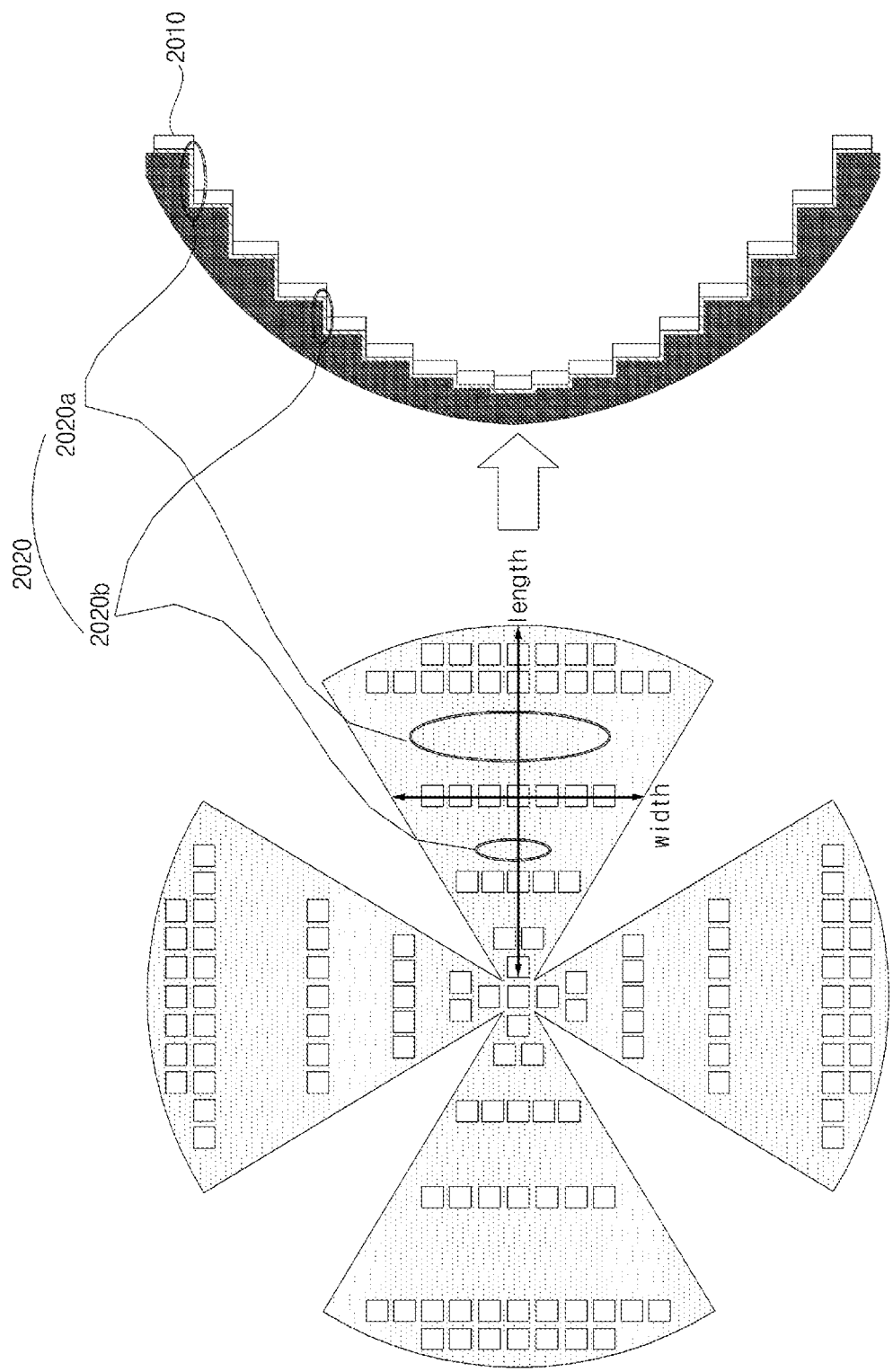
FIG. 21 is a diagram for explaining an array module which is stepped.

FIG. 21 is a diagram for explaining an example array module including stepped portions.

Referring to FIG. 21, each of the second regions 2020 may decrease in length in a direction from the periphery to the center of the array module 200m.

Each of the second regions 2020 may increase in length in a direction from the center to the periphery of the array module 200m.

For example, the plurality of second regions 2020 may include a 2a region 2020a and a 2b region 2020b. The 2b region 2020b may be closer to the center of the array module 200m than the 2a region 2020a. The 2b region 2020b may have a length shorter than a length of the 2a region 2020a.

In some implementations, a length of the array module 200m (or a subarray module) may be defined as a distance from a center to a periphery.

In some implementations, a width of the array module 200m (or a subarray module) may be defined as a distance between two sides which forms an angle at the center.

Figure 22:
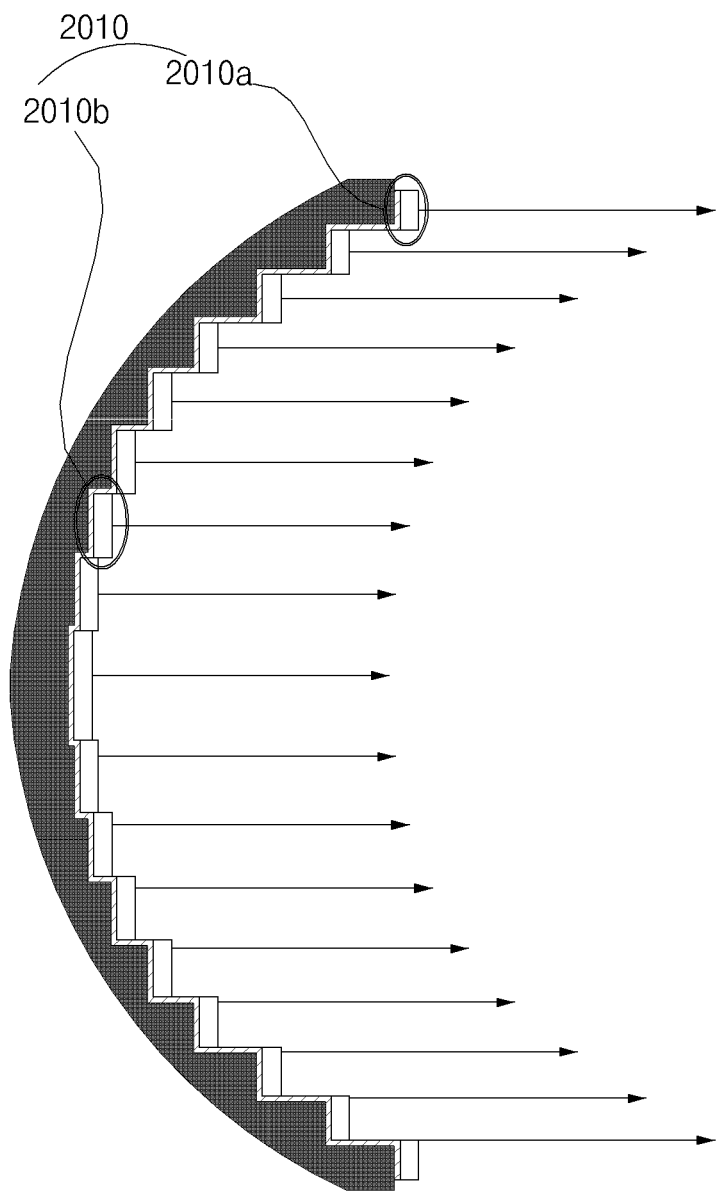
FIG. 22 is a diagram for explaining an example of an array module including stepped portions.

FIG. 22 is a diagram for explaining an example array module including stepped portions.

Referring to FIG. 22, each of the plurality of first regions 2010 may increase in length in a direction from the periphery toward the center of the array module 200m.

Each of the plurality of first regions 2010 may decrease in length in a direction from the center toward the periphery of the array module 200m.

For example, the plurality of first regions may include a 1a region 2010a and a 1b region 2010b. The 1b region 2010b may be closer to the center of the array module 200m than the 1a region 2010a. The 1b region 2010b may have a length greater than a length of the 1a region 2010a.

The number of micro LED chips 920 disposed in the plurality of first regions 2010 may increase on the basis of a unit width in a direction toward the center of the array modules 200m.

For example, the number of micro LED chips 920 disposed in the 1b region 2010b on the basis of a unit width may be greater than the number of micro LED chips 920 disposed in the 1a region 2010a on the basis of the unit width.

Figure 23:
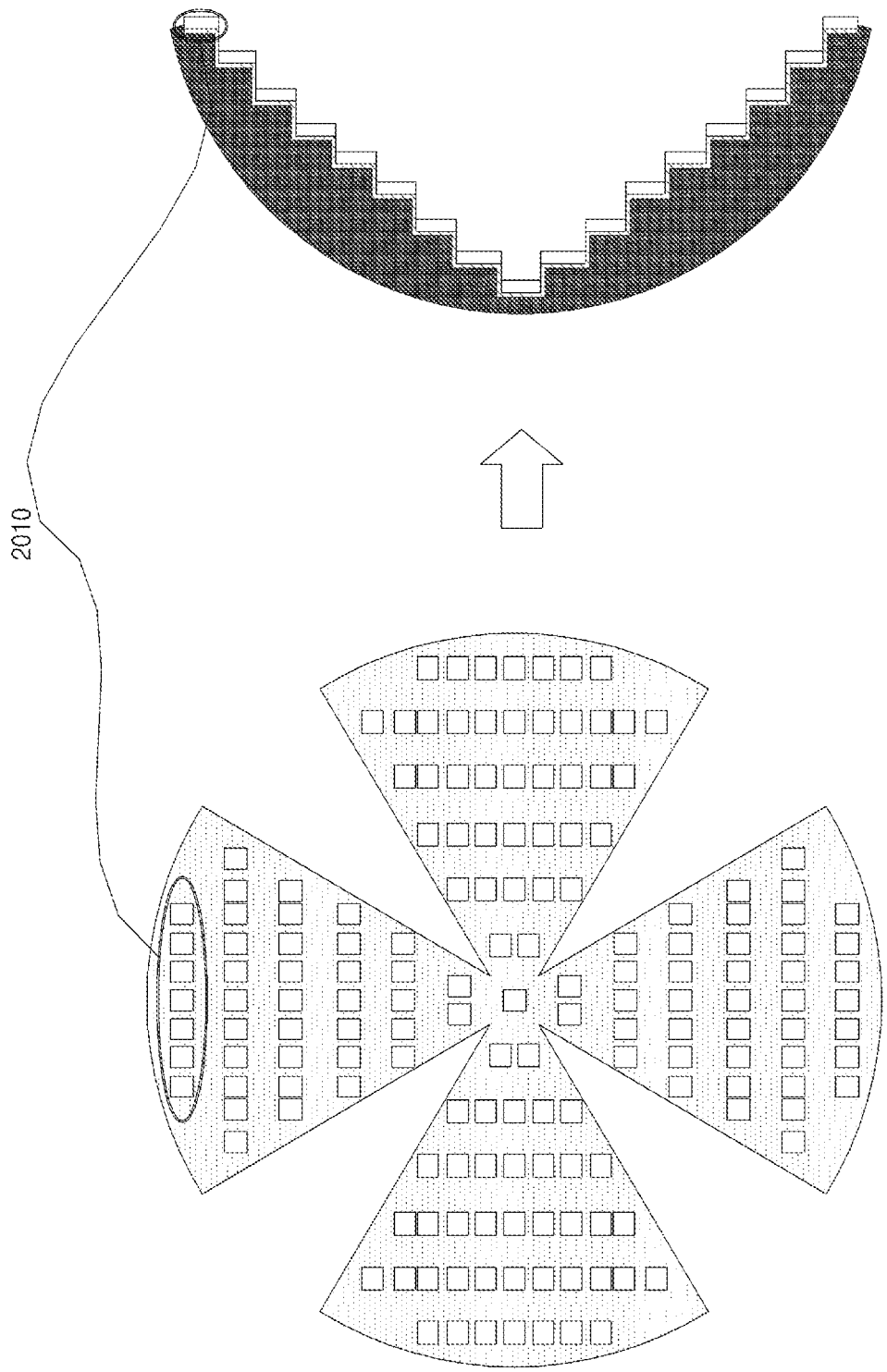
FIGS. 23 and 24 are diagrams for explaining an example of an array module including stepped portions.
Figure 24:
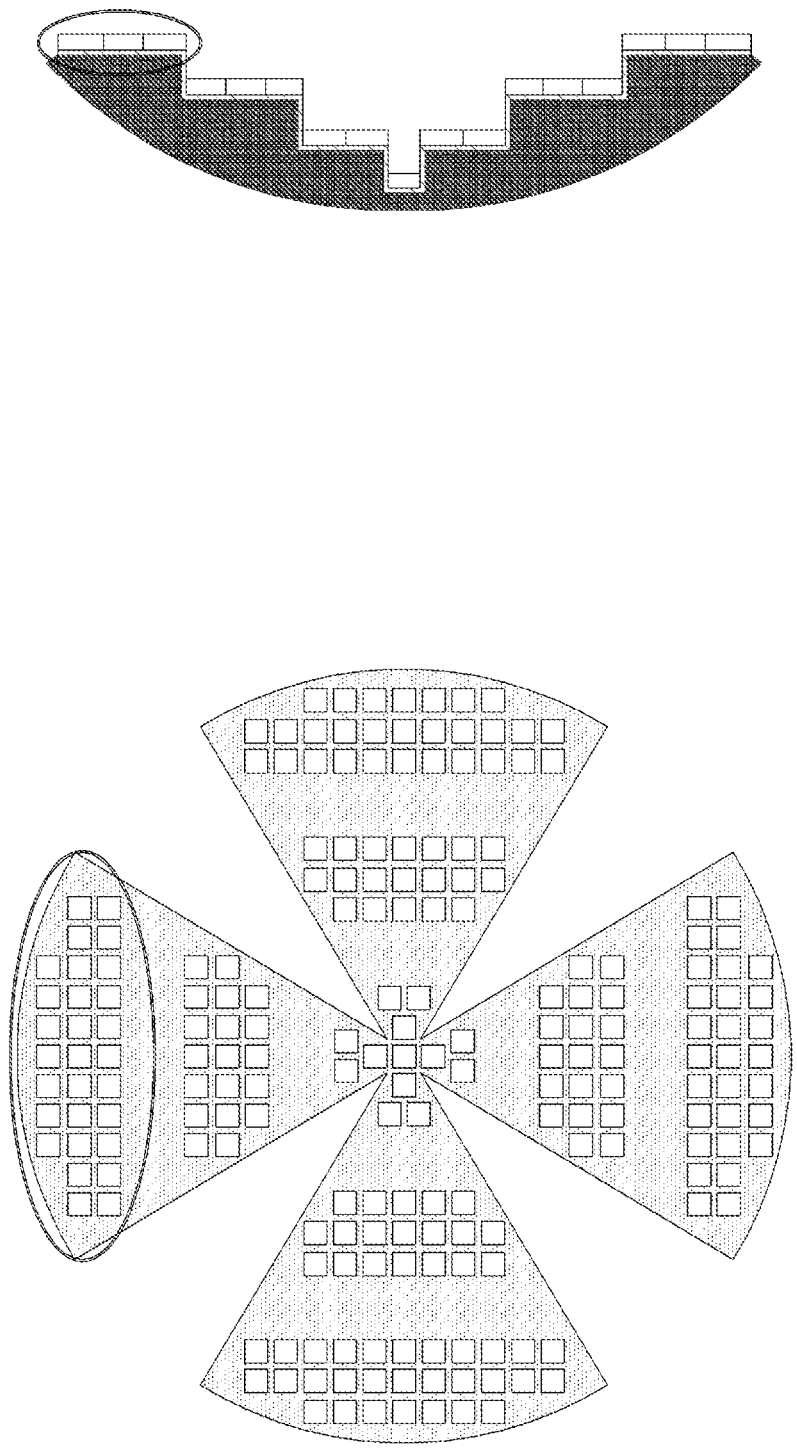

FIGS. 23 and 24 are diagrams for explaining an array module which is stepped.

As illustrated in FIG. 23, a one-row array may be disposed in each of the plurality of first regions 2010.

A one-row array may include multiple unit arrays disposed in a row.

As illustrated in FIG. 24, a multi-row array may be disposed in each of the plurality of first regions 2010.

The multi-row array may include multiple unit arrays disposed in two or more rows.

Figure 25:
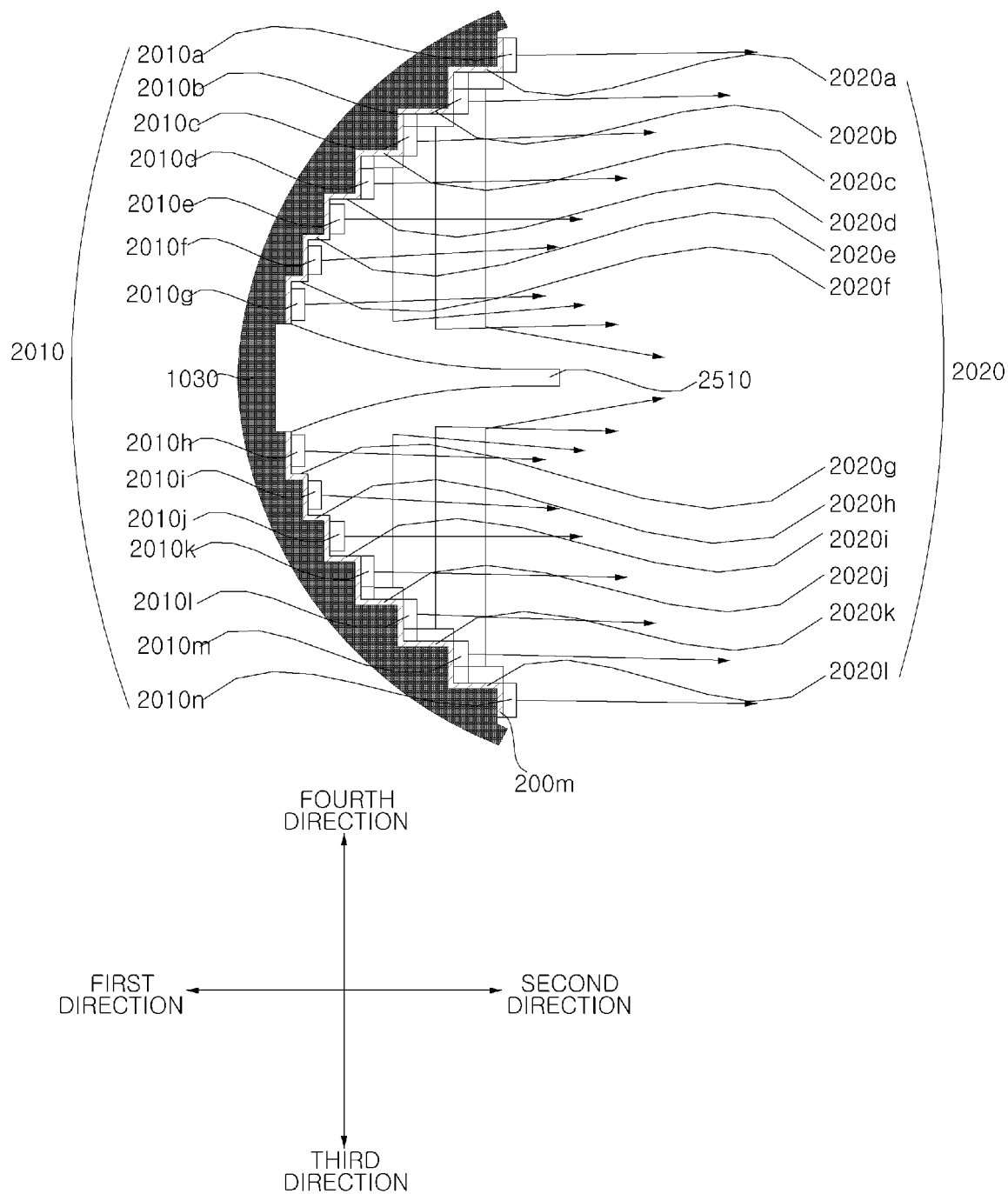
FIG. 25 is a diagram illustrating an example lamp for a vehicle.

FIG. 25 is a diagram illustrating an example lamp for a vehicle.

Referring to FIG. 25, the plurality of micro LED chips 920 may be disposed in the first region 2010.

The plurality of micro LED chip 920 may be disposed in the second regions 2020.

Each second region 2020 may be defined as a region directed toward at least one portion of the array module 200m when the array module 200m is in a 3D shape.

For example, every two second regions 2020 are paired to face each other.

The lamp 100 may further include a 3D reflector 2510.

The 3D reflector 2510 may reflect light that is generated by the plurality of micro LED chips 920 disposed in the second regions 2020.

For example, the 3D reflector 2510 may reflect light, which is generated by the plurality of micro LED chips 920 disposed in the second regions 2020 and travels in the third direction or the fourth direction, in the second direction.

The 3D reflector 2510 may have a sectional area that is gradually reduced in the second direction from the center of the array module 200m.

For example, the 3D reflector 2510 may have a sectional area that is gradually reduced in a light output direction from the center of the array module 200m.

In some implementations, a longitudinal section of the 3D reflector 2510 may be polygonal or circular.

For example, a section of the 3D reflector 2510 cut along a direction perpendicular to the light output direction may polygonal or circular.

Figure 26:
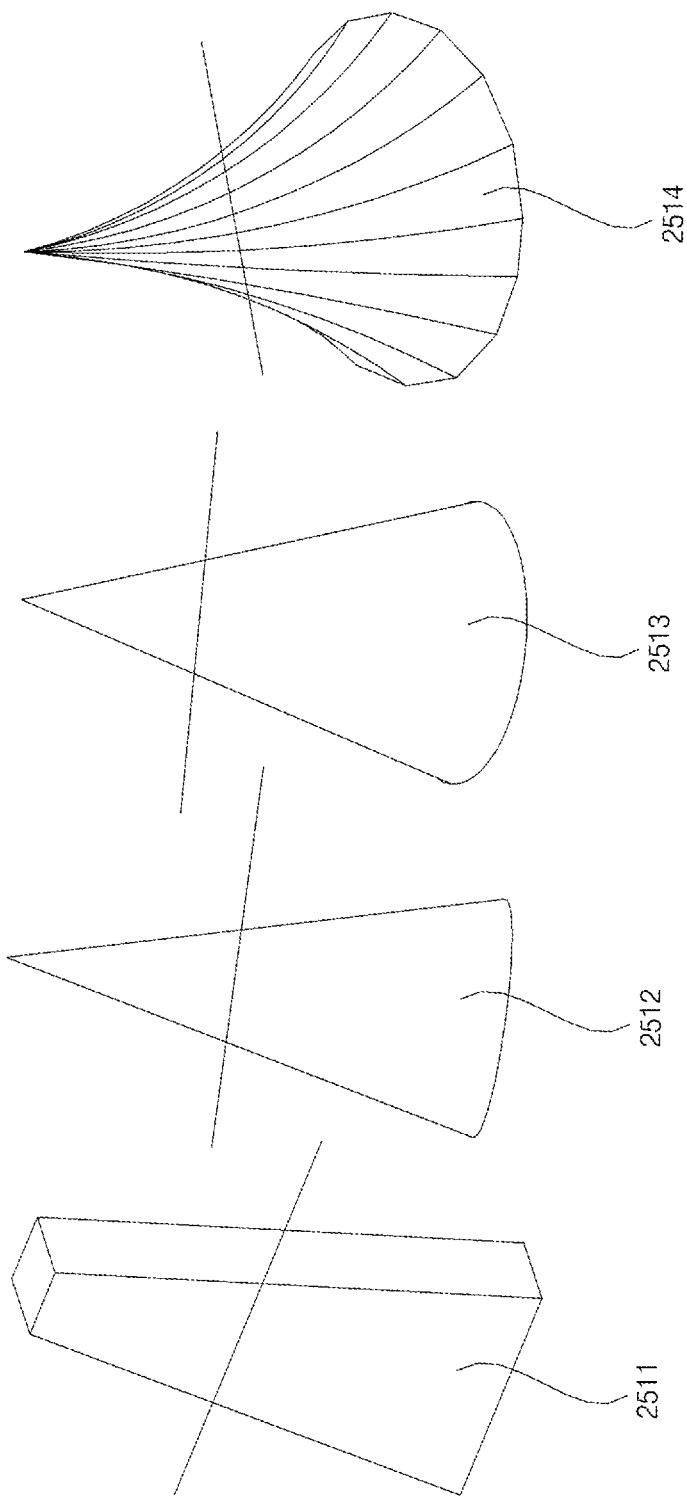
FIG. 26 is a diagram for explaining an example 3D reflector.

FIG. 26 is a diagram for explaining an example 3D reflector.

Referring to FIG. 26, the 3D reflector 2510 may include at least one of a quadrangular cylinder 2511, a circular cone 2512, a polygonal cone 2513, or a concave cone 2514.

In the case where micro LED chips 920 are disposed even in the second regions when the array module 200*m* has a parabolic shape, light may be output in the second direction due to the shape of the 3D reflector 2510. In this case, an amount of light may increase.

Figure 27:
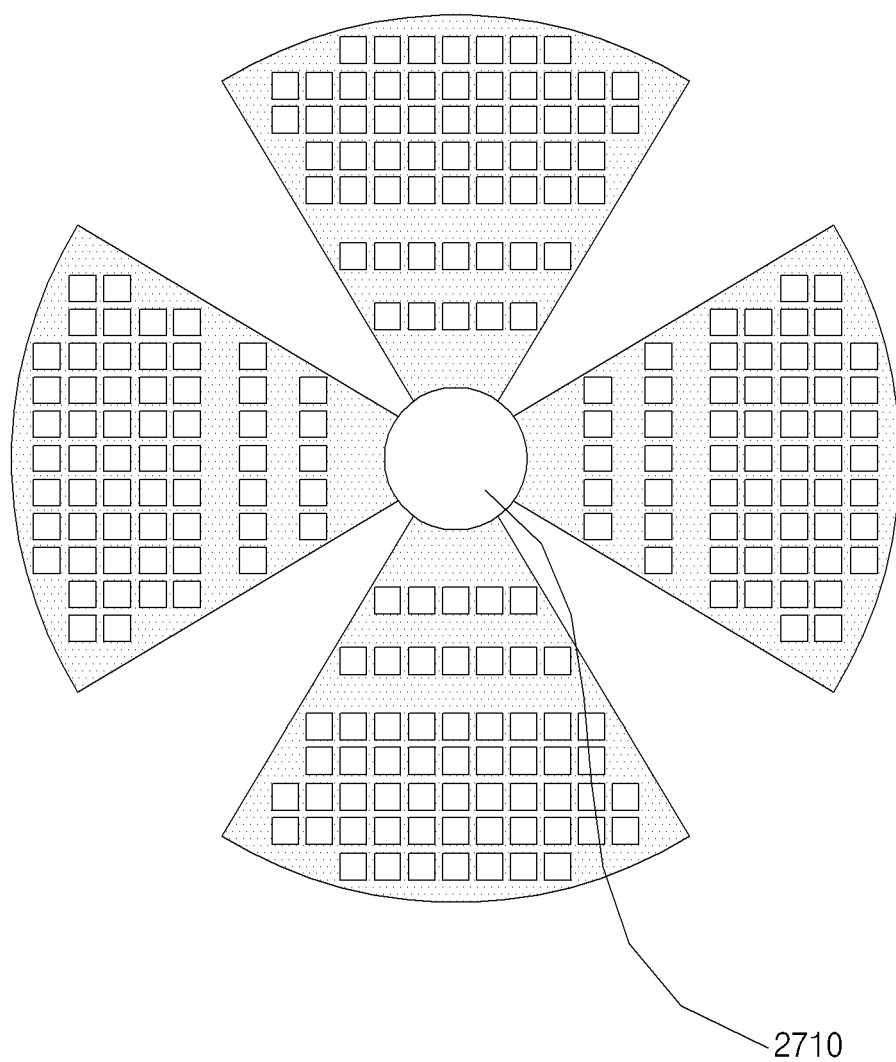
FIG. 27 is a diagram illustrating an example of an array module developed into one plane.

FIG. 27 is a diagram illustrating an example of an array module developed into one plane.

Referring to FIG. 27, the array module 200*m* developed into one plane may include a hole 2710.

The hole 2710 may takes the shape of a section of the 3D reflector 2510.

Passing through the hole 2710, the 3D reflector 2510 may be fixed onto the bracket 1030.

Figure 28:
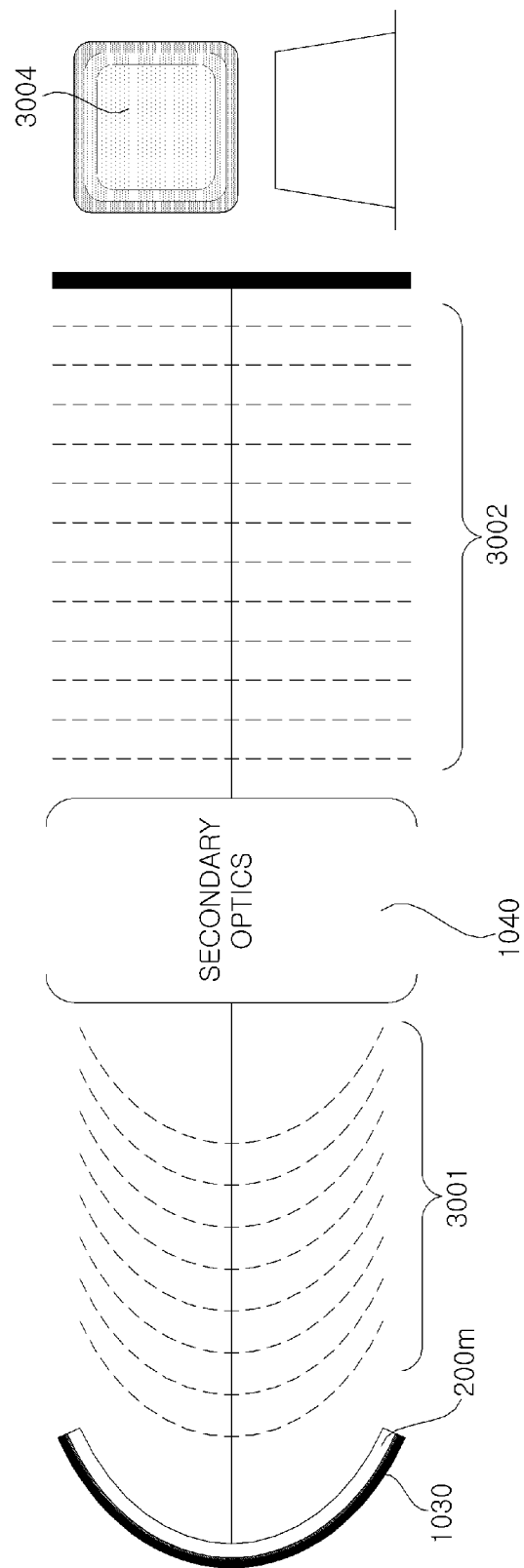
FIGS. 28 and 29 are diagrams for explaining an example lamp for a vehicle.
Figure 29:
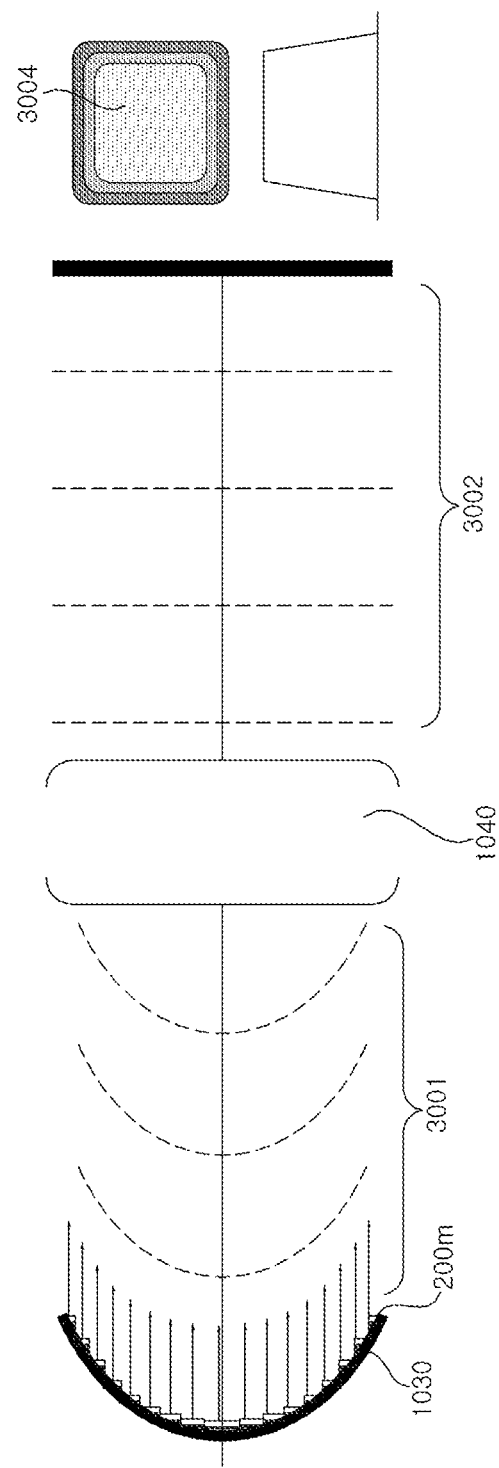

FIGS. 28 and 29 are diagrams for explaining an example lamp for a vehicle.

Referring to FIG. 28, the array module 200*m* may have a shape concave in the first direction, as described above with reference to FIGS. 9 to 26.

For example, the array module 200*m* may be a parabolic shape concave in the first direction.

The description provided with reference to FIGS. 1 to 27 may be applied to the array module 200*m*.

Due to the shape concave in the first direction, the array module 200*m* may output a curved waveform 3001 of lights.

The lens system 1040 may change a waveform of incident light.

The lens system 1040 may change a waveform of light output from the array module 200*m*.

The lens system 1040 may convert the curved waveform 3001 of light into a plane waveform 3002.

As indicated by reference numeral 3004, light may be uniformly distributed on a light incidence surface due to the light whose waveform is changed by the lens system 1040.

The lens system 1040 may change an optical path of light generated by the array module 200*m*.

The lens system 1040 may have a positive optical power.

An optical power may be defined as the degree to which an optical system converges or diverges light.

In the case where an optical power is positive, the lens system 1040 may have a convex nature overall.

In the case where an optical power is negative, the lens system 1040 may have a concave nature overall.

The optical power may be defined as the inverse number of a focal length. The greater the optical power, the longer the focal length. The smaller the optical power, the shorter the focal length.

In the case where the lens system 1040 is composed of one lens, the optical power of the lens system 1040 may be determined to be a sum of optical powers of the front and rear surfaces of the lens.

In the case where the lens system 1040 is composed of multiple lenses, the optical power of the lens system 1040 may be determined to be a sum of optical powers of the multiple lenses.

Referring to FIG. 29, the array module 200*m* may has a stepped shape concave in the first direction.

For example, the array module 200*m* may be a stepped parabolic shape concave in the first direction.

The description provided with reference to FIGS. 1 to 27 may be applied to the array module 200*m*.

The lens system 1040 may change a waveform of incident light.

The lens system 1040 may change a waveform of light output from the array module 200*m*.

The lens system 1040 may have a positive optical power.

Figure 30:
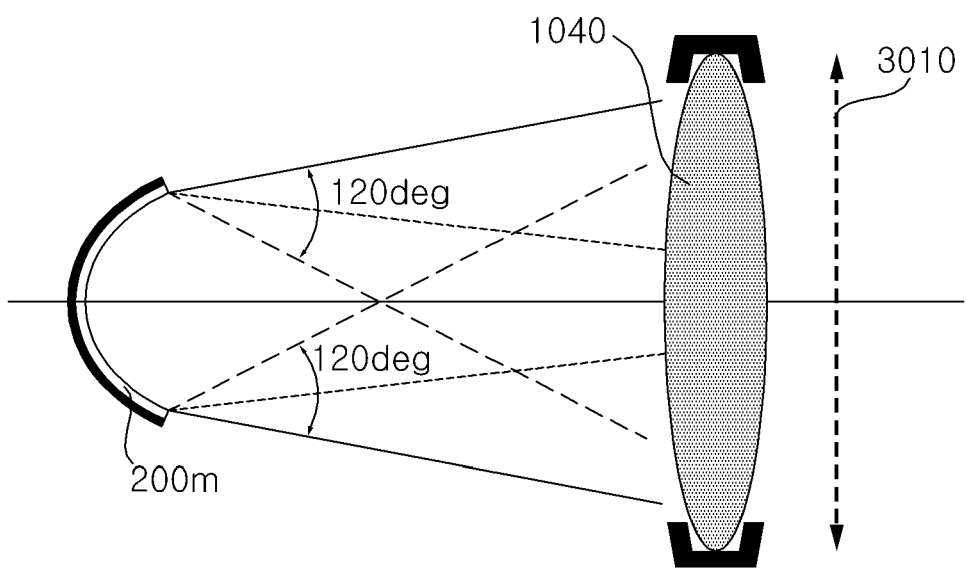
FIG. 30 is a diagram for explaining a lens system in a lamp for a vehicle.

FIG. 30 is a diagram for explaining an example lens system in an example lamp for a vehicle.

Referring to FIG. 30, a section length 3010 of the lens system 1040 may be determined by a beam angle of the array module 200*m*.

The array module 200*m* may include a plurality of micro LED chips 920.

The section length 3010 of the lens system 1040 may be determined by a beam angle of a micro LED chip 920 disposed on the outermost side of the array module 200*m*.

For example, a lateral section length of the lens system 1040 may be determined by a beam angle of a micro LED chip disposed on the outermost side of the array module 200*m* in the third direction and a beam angle of a micro LED chip disposed on the outermost side of the array module 200*m* in the fourth direction.

For example, a longitudinal length of the lens system 1040 may be determined by a beam angle of a micro LED chip disposed on the outermost side of the array module 200*m* in a fifth direction and a beam angle of a micro LED chip disposed on the outermost side of the array module 200*m* in a sixth direction.

The sixth direction may be defined as a direction perpendicular to the first, second, third, and fourth directions.

The sixth direction may be defined as a direction opposite to the fifth direction.

Figure 31A:
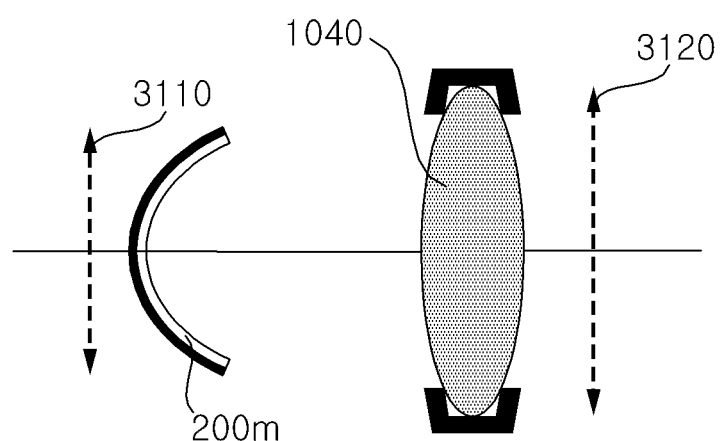
FIGS. 31A and 31B are diagrams for explaining an example lens system in an example lamp for a vehicle.
Figure 31B:
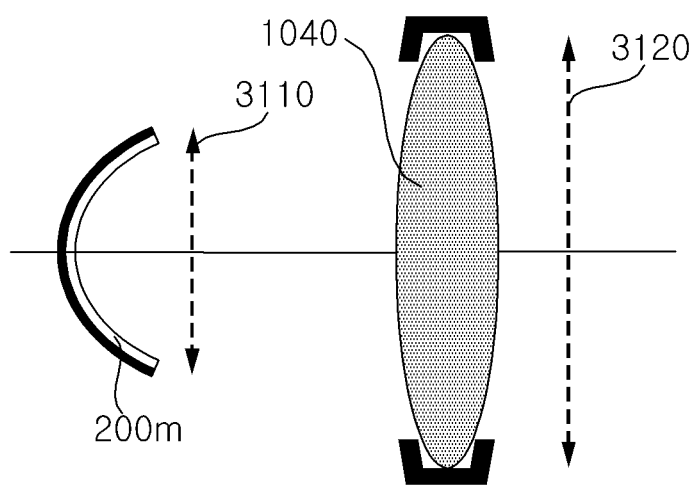

FIGS. 31A and 31B are diagrams for explaining a lens system in a lamp for a vehicle.

Referring to FIGS. 31A and 31B, a section length of the lens system 1040 may be determined based on a section length of the array module 200*m*.

The section length of the lens system 1040 may be proportional to the section length of the array module 200*m*.

As illustrated in FIGS. 31A and 31B, as the section length of the array module 200*m* increases, the section length of the lens system 1040 may increase.

For example, a lateral section length of the lens system 1040 may be proportional to a lateral section length of the array module 200*m*.

For example, a longitudinal section length of the lens system 1040 may be proportional to a longitudinal section length of the array module 200*m*.

Figure 32A:
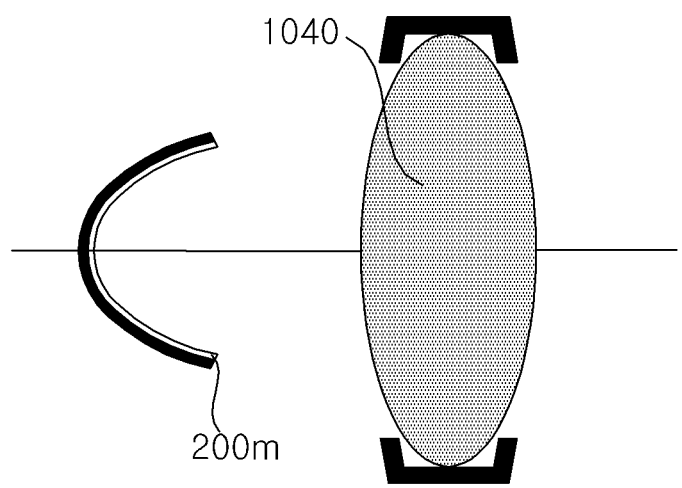
FIGS. 32A and 32B are diagrams for explaining an example lens system in an example lamp for a vehicle.
Figure 32B:
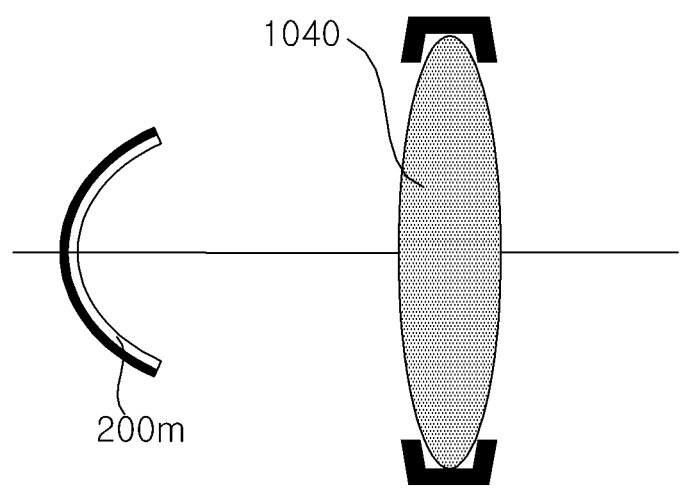

FIGS. 32A and 32B are diagrams for explaining a lens system in a lamp for a vehicle.

Referring to FIGS. 32A and 32B, an optical power of the lens system 1040 may be determined based on a curvature of the array module 200*m*.

The optical power of the lens system 1040 may be proportional to the curvature of the array module 200*m*.

As illustrated in FIGS. 32A and 32B, as the curvature of the array module 200*m* increases, the optical power of the lens system 1040 may increase.

For example, as the curvature of the array module 200*m* increases in the third direction and the fourth direction of the lens system 1040, the curvature of the lens system 1040 in the third direction and the fourth direction may increase.

For example, as the curvature of the array module 200*m* increases in the fifth direction and the sixth direction of the lens system 1040, the curvature of the lens system 1040 in the fifth direction and the sixth direction may increase.

Figure 33:
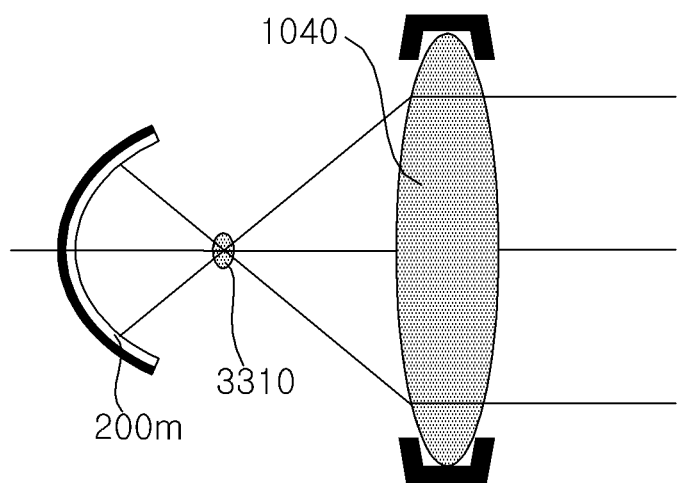
FIG. 33 is a diagram for explaining an example lens system in an example lamp for a vehicle.

FIG. 33 is a diagram for explaining an example lens system in an example lamp for a vehicle.

Referring to FIG. 33, the center of curvature of the array module 200*m* may be located between the array module 200*m* and the lens system 1040.

When the center (3310) of curvature of the array module 200*m* is located in the lens system 1040 or between the lens system 1040 and a cover lens 1020, the lens system 1040 is incapable of inducing waveform change.

The center (3310) of curvature of the array module 200m may be referred to as a focus.

FIGS. 34 to 39 are diagrams for explaining various examples of a lens system in an example lamp for a vehicle.

Figure 34:
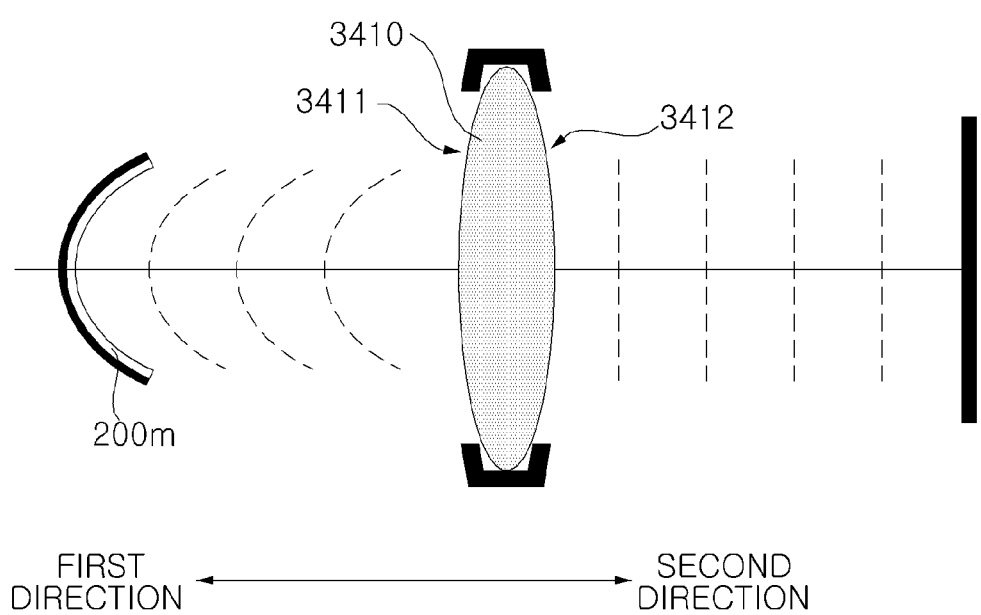
FIGS. 34 to 39 are diagrams for explaining various examples of a lens system in an example lamp for a vehicle.

Referring to FIG. 34, the lens system 1040 may include a first lens 3410.

The first lens 3410 may have at least one convex surface.

The first lens 3410 may include a first surface 3411 and a second surface 3412.

The first surface 3411 may be a surface directed toward the array module 200m.

The first surface 3411 may be a surface facing the array module 200m.

The second surface 3412 may be a surface opposing the first surface 3411.

The first surface 3411 and the second surface 3412 may be convex in heading directions of the first surface 3411 and the second surface 3412, respectively. That is, the first surface 3411 may be convex in the first direction, and the second surface 3412 may be convex in the second direction.

The first lens 3410 may have a first optical power.

The first optical power may be determined by a sum of an optical power of the first surface 3411 and an optical power of the second surface 3412.

Figure 35A:
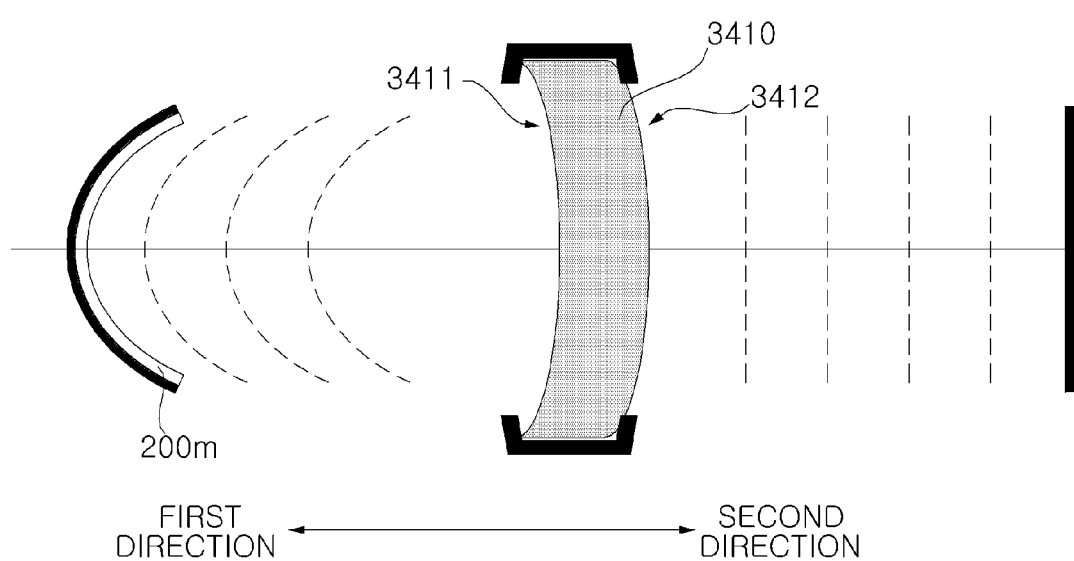

Referring to FIG. 35A, the first surface 3411 may be concave in a heading direction of the first surface 3411, and the second surface 3412 may be convex in a heading direction of the second surface 3412. That is, the first surface 3411 may be concave in the first direction, and the second surface 3412 may be convex in the second direction. In this case, an optical power of the second surface 3412 may be greater than the absolute value of an optical power of the first surface 3411. In this case, a sum of the optical power of the first surface 3411 and the optical power of the second surface 3412 may be a positive value. In this case, the first lens 3410 may have a convex nature overall.

Figure 35B:
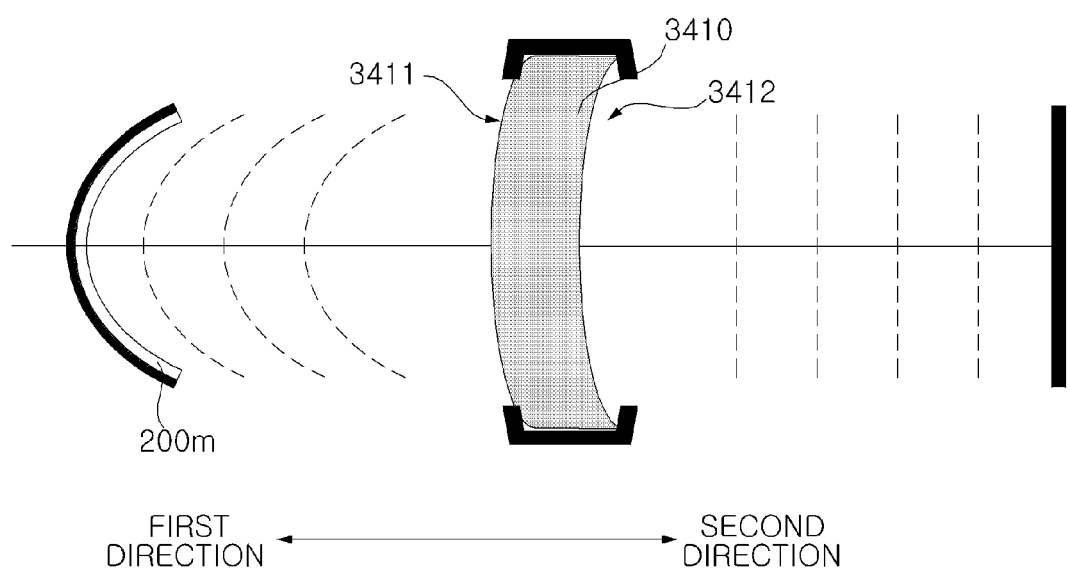

Referring to FIG. 35B, the first surface 3411 may be convex in a heading direction of the first surface 3411, and the second surface 3412 may be concave in a heading direction of the second surface 3412. That is, the first surface 3411 may be convex in the first direction, and the second surface 3412 may be concave in the second direction. In this case, an optical power of the first surface 3411 may be greater than the absolute value of an optical power of the second surface 3412. In this case, a sum of the optical power of the first surface 3411 and the optical power of the second surface 3412 may be a positive value. In this case, the first lens 3410 may have a convex nature overall.

Figure 36A:
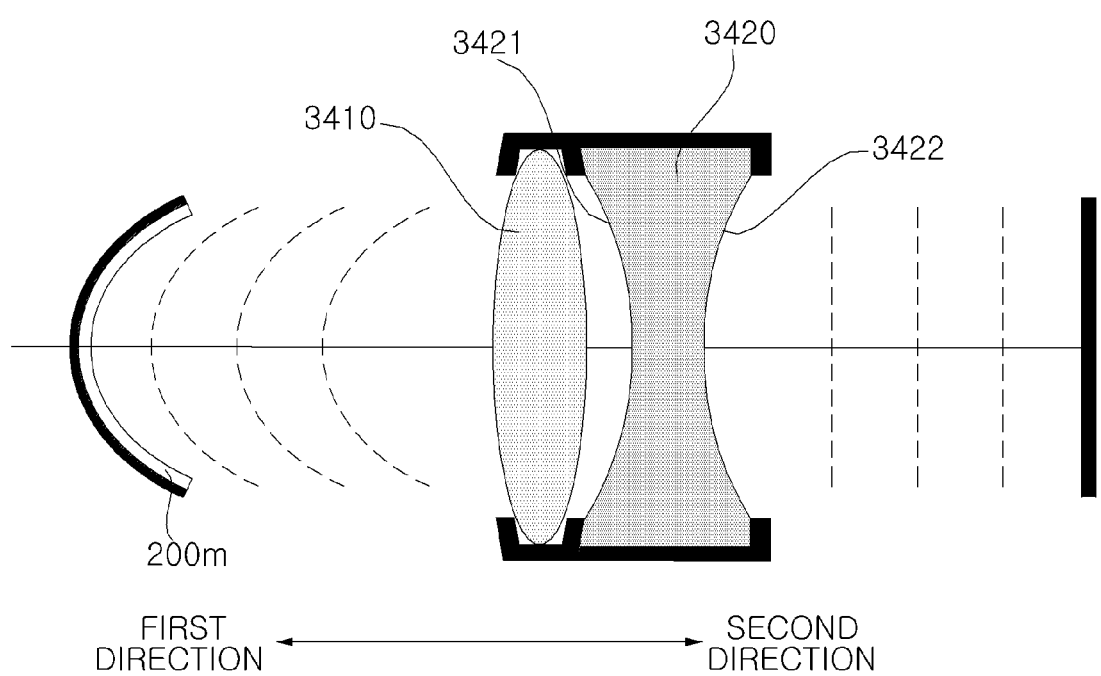
Figure 36B:
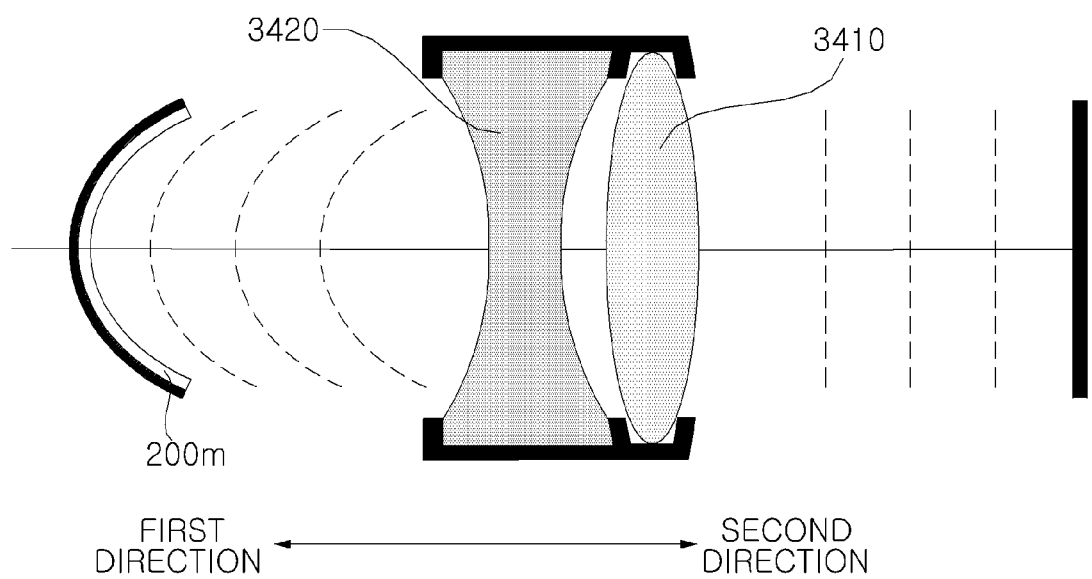

FIGS. 36A and 36B, the lens system 1040 may include a first lens 3410 and a second lens 3420.

The first lens 3410 may be the same as described above with reference to FIGS. 34 to 35B.

The second lens 3420 may have at least one concave surface.

The second lens 3420 may include a first surface 3421 and a second surface 3422.

The first surface 3421 may be a surface directed toward the array module 200m.

The first surface 3421 may be a surface facing the array module 200m.

The second surface 3422 may be a surface opposing the first surface 3421.

The first surface 3421 and the second surface 3422 may be concave in heading directions of the first surface 3421 and the second surface 3422, respectively. That is, the first surface 3421 may be concave in the first direction, and the second surface 3422 may be concave in the second direction.

The second lens 3420 may have a second optical power.

The second optical power may be determined by a sum of the optical power of the first surface 3421 and the optical power of the second surface 3422.

The first optical power may be greater than the second optical power.

The second optical power may be smaller than the first optical power.

In this case, the lens system 1040 may overall have a positive optical power. In this case, the lens system 1040 may have a convex nature overall.

In some implementations, as illustrated in FIG. 36A, the second lens 3420 may be disposed between the first lens 3410 and the cover lens 1020.

In some implementations, as illustrated in FIG. 36B, the second lens 3420 may be disposed between the array module 200m and the first lens 3410.

Figure 37:
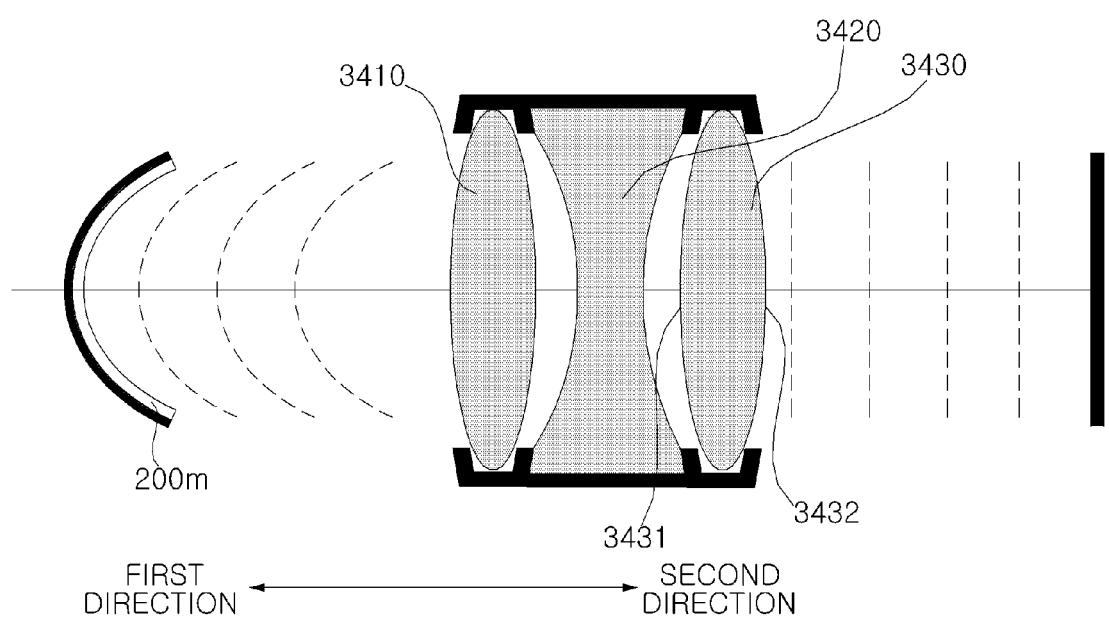

Referring to FIG. 37, the lens system 1040 may include a first lens 3410, a second lens 3420, and a third lens 3430.

The first lens 3410 and the second lens 3420 are the same as described above with reference to FIGS. 34 to 36B.

The third lens 3430 may have at least one convex surface.

The third lens 3430 may include a first surface 3431 and a second surface 3432.

The first surface 3431 may be a surface directed toward the array module 200m.

The first surface 3431 may be a surface facing the array module 200m.

The second surface 3432 may be a surface opposing the first surface 3431.

The first surface 3431 and the second surface 3432 may be convex in heading directions of the first surface 3431 and the second surface 3432, respectively. That is, the first surface 3431 may be convex in the first direction, and the second surface 3432 may be convex in the second direction.

The third lens 3430 may have a third optical power.

The third optical power may be determined by a sum of the optical power of the first surface 3431 and the optical power of the second surface 3432.

The second lens 3420 may be disposed between the first lens 3410 and the third lens 3430.

As the second lens 3420 is disposed between the first lens 3410 and the third lens 3430, the lens system 1040 may occupy a less volume, which, in some examples, may make it easy to design a lamp for a vehicle.

A sum of the absolute value of the first optical power and the absolute value of the third optical power may be greater than the absolute value of the second optical power.

In this case, the lens system 1040 may have a positive optical power overall. In this case, the lens system 1040 may have a convex nature overall.

In some implementations, as illustrated in FIGS. 34 to 35B, the lens system 1040 may include an odd number of lenses.

In this case, the lens system 1040 may include convex lenses whose number is greater than the number of concave lenses.

In this case, the lens system 1040 may include lenses having negative optical powers, whose number is greater than the number of lenses having positive optical powers.

Figure 38:
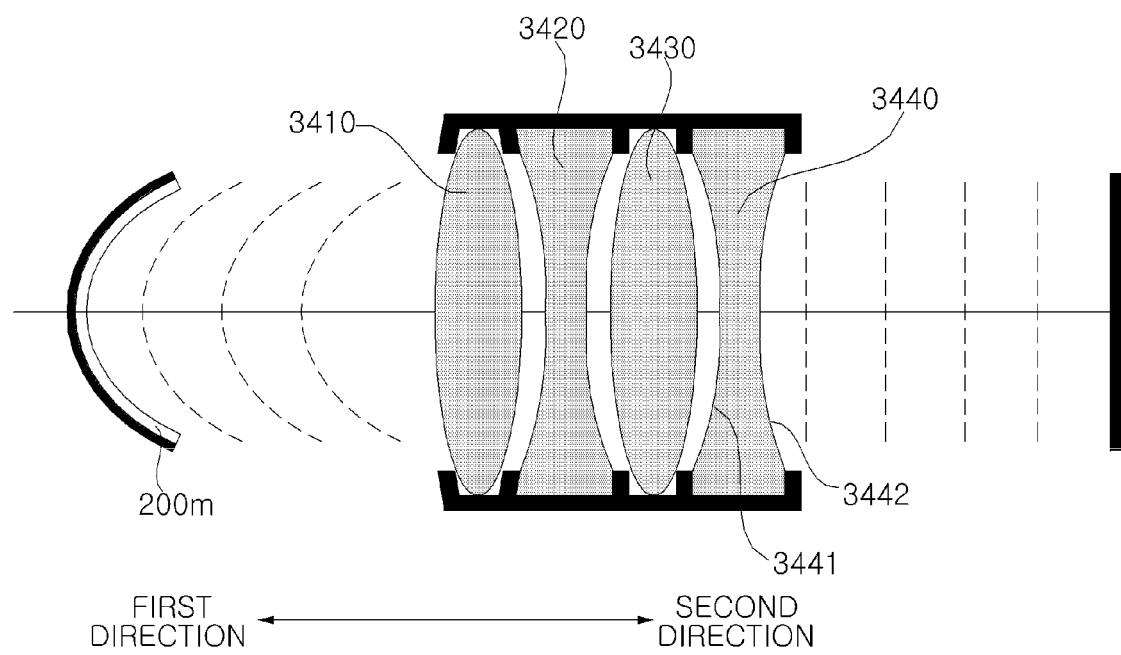

Referring to FIG. 38, the lens system 1040 may include a first lens 3410, a second lens 3420, a third lens 3430, and a fourth lens 3440.

The first lens 3410 and the second lens 3420 are the same as described above with reference to FIGS. 34 to 37.

The fourth lens 3440 may include a first surface 3441 and a second surface 3442.

The first surface 3441 may be a surface directed toward the array module 200m.

The first surface 3441 may be a surface facing the array module 200m.

The second surface 3442 may be a surface opposing the first surface 3441.

The first surface 3441 and the second surface 3442 may be concave in heading directions of the first surface 3441 and the second surface 3442, respectively. That is, the first surface 3441 may be concave in the first direction, and the second surface 3442 may be concave in the second direction.

The fourth lens 3440 may have a fourth optical power.

The fourth optical power may be determined by a sum of the optical power of the first surface 3441 and the optical power of the second surface 3442.

A sum of the absolute value of the first optical power and the absolute value of the third optical power may be greater than a sum of the absolute value of the second optical power and the absolute value of the fourth optical power.

In this case, the lens system 1040 may have a positive optical power overall. In this case, the lens system 1040 may have a convex nature overall.

In some implementations, as illustrated in FIGS. 36A, 36B, and 38, the lens system 1040 may include an even number of lenses.

In this case, a sum of absolute values of optical powers of convex lenses included in the lens system 1040 may be greater than a sum of absolute values of optical powers of concave lenses included in the lens system 1040.

Figure 39:
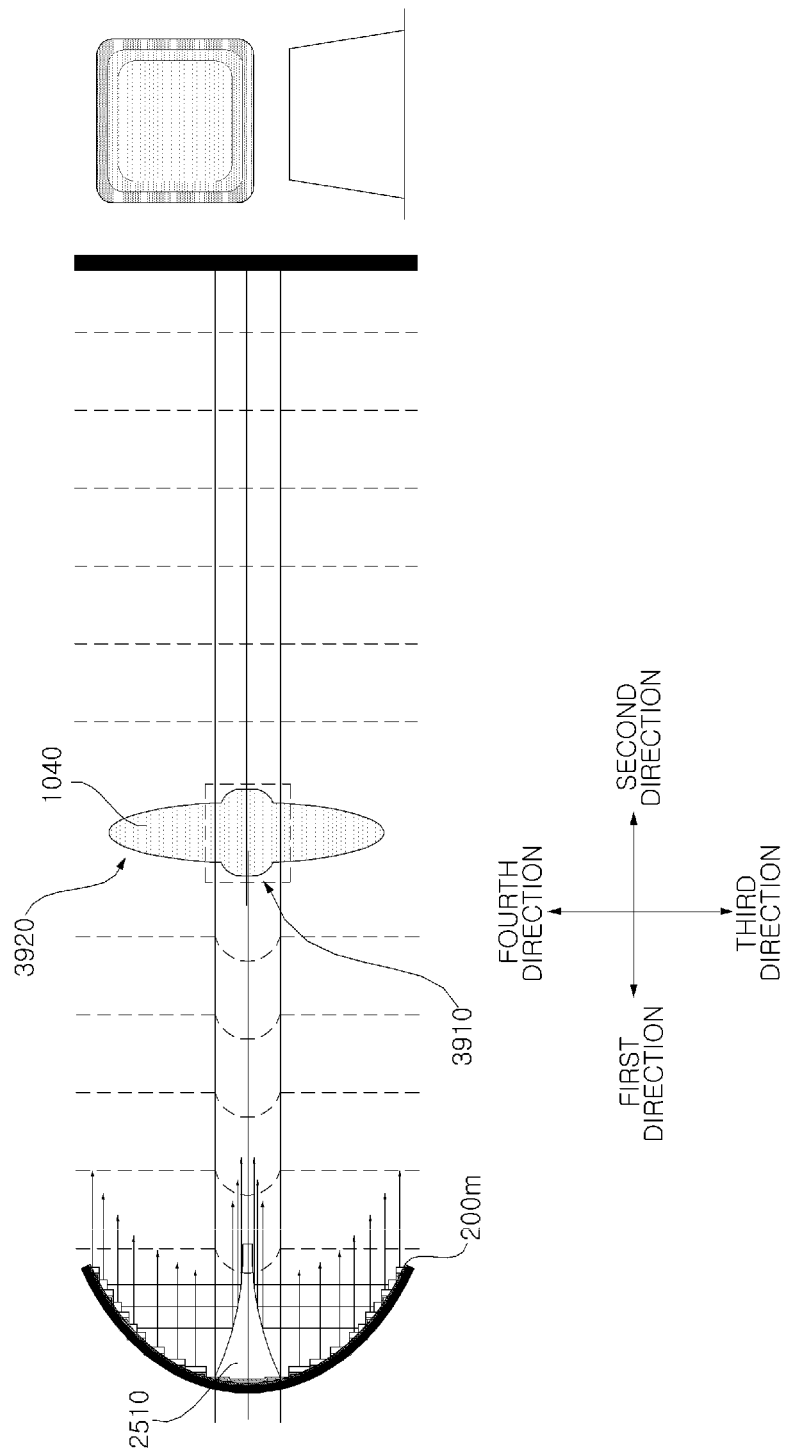

Referring to FIG. 39, the array module 200m may be formed to be stepped, as described above.

For example, when being in a 3D shape, the array module 200m may be formed to be stepped in a direction different from the first direction.

For example, the array module 200m in a 3D shape may be formed to be stepped in a third direction or a fourth direction which is at a predetermined angle relative to the first direction.

For example, the array module 200m in a 3D shape may be formed to be stepped in an upward-downward direction.

As being formed to be stepped, the array module 200m may have a stair-shaped lateral section. In this case, the array module 200m may have a structure which is horizontally symmetric.

The array module 200m may include a plurality of first regions 2010 and a plurality of second regions 2020.

The array module 200m may include a plurality of first regions directed toward the second direction, and a plurality of second regions directed to at least one portion of the array module 200m.

Some of a plurality of micro LED chips may be disposed in the first regions, and the rest thereof may be disposed in the second regions.

The lamp 100 may further include a 3D reflector 2510.

The 3D reflector 2510 may reflect light that is generated by the plurality of micro LED chips disposed in the second regions 2020.

The lens system 1040 may include a central portion 3910 and a peripheral portion 3920.

The central portion 3910 may be a portion corresponding to the 3D reflector 2510.

The central portion 3910 may be a portion of the lens system 1040 that light, which is generated by a plurality of micro LED chips disposed in the second regions and which is reflected by the 3D reflector 2510, passes there through.

The peripheral portion 3920 may be a portion corresponding to a portion of the array module 200m other than the 3D reflector 2510.

The peripheral portion 3920 may be a portion of the lens system 1040 that light, which is generated by the plurality of micro LED chips disposed in the first regions, passes therethrough.

Light which is generated by micro LED chips disposed in the second regions 2020 and which is reflected by the 3D reflector 2510 may form a curved waveform with a curvature greater than a curvature of light which is generated by micro LED chips disposed in the first regions 2010.

An optical power of the central portion 3910 may be greater than an optical power of the peripheral portion 3920.

A convex nature of the central portion 3910 may be greater than a convex nature of the peripheral portion 3920.

As the optical power of the central portion 3910 has an optical power than that of the peripheral portion 3920, the lamp 100 may uniformly output light to the outside.

The present disclosure may be realized in another concrete configuration (or formation) without deviating from the scope and spirit of the essential characteristics of the present disclosure. Therefore, in all aspect, the detailed description of present disclosure is intended to be understood and interpreted as an exemplary implementation of the present disclosure without limitation. The scope of the present disclosure shall be decided based upon a reasonable interpretation of the appended claims of the present disclosure and shall come within the scope of the appended claims and their equivalents. Therefore, it is intended that the present disclosure covers the modifications and variations of this disclosure provided they come within the scope of the appended claims and their equivalents, and it is not intended to limit the present disclosure only to the examples presented herein.

What is claimed is:

1. A lamp for a vehicle, comprising:
an array module comprising a plurality of micro Light Emitting Diode (LED) chips, the array module having a shape that is concave in a first direction,
wherein the array module comprises:
one or more stepped portions,
a plurality of first regions oriented toward a second direction opposite to the first direction, and
a plurality of second regions oriented toward at least a portion of the array module,
wherein at least a portion of the plurality of micro LED chips is disposed in the plurality of first regions,
wherein the array module further comprises a plurality of subarray modules,
wherein each of the plurality of subarray modules comprises at least one region having a width that increases in a direction from a center of the array module toward a periphery of the array module in a view in which the array module is developed into one plane,
wherein each of the plurality of subarray modules comprises, in the view in which the array module is developed into one plane:
a first side that extends from the center of the array module to the periphery of the array module; and
a second side that contacts the first side at the center of the array module and that extends from the center of the array module to the periphery of the array module, and
wherein the first side and the second side define a predetermined angle about the center of the array module.

2. The lamp according to claim 1, wherein a length of each of the plurality of second regions decreases in a direction toward a center of the array module.

3. The lamp according to claim 1, wherein a number of micro LED chips is determined based on a unit width, and
wherein the number of micro LED chips disposed in the plurality of first regions increases in a direction toward a center of the array module.

4. The lamp according to claim 1, wherein at least a portion of the plurality of micro LED chips is disposed in the plurality of second regions.

5. The lamp according to claim 4, further comprising a three-dimensional (3D) reflector configured to reflect light generated by the plurality of micro LED chips disposed in the plurality of second regions.

6. The lamp according to claim 5, wherein the 3D reflector extends in the second direction, and
wherein a cross-sectional area of the 3D reflector decreases in the second direction from a center point of the array module.

7. The lamp according to claim 6, wherein a longitudinal cross-section of the 3D reflector has a polygonal shape or a circular shape.

8. The lamp according to claim 5, wherein the array module defines a hole having a shape corresponding to a shape of a cross-section of the 3D reflector.

9. The lamp according to claim 1, wherein an interval between the plurality of subarray modules increases from the center of the array module toward the periphery of the array module in the view in which the array module is developed into one plane.

10. The lamp according to claim 1, wherein each of the plurality of subarray modules has a fan shape,
wherein the plurality of subarray modules are configured to couple to one another, and
wherein an interval between the plurality of subarray modules increases in a direction from a center of the fan shape toward an arc of the fan shape in a state in which the plurality of subarray modules are spaced apart from one another.

11. The lamp according to claim 1, further comprising a lens configured to transmit light emitted from the array module,
wherein the array module has a 3D shape in which the plurality of subarray modules are arranged, and
wherein a distance from a periphery of each of the plurality of subarray modules to an optical axis of the lens is greater than a distance from a center of each of the plurality of subarray modules to the optical axis of the lens.

12. The lamp according to claim 11, wherein each of the plurality of subarray modules is configured to bend in one or more directions with respect to the optical axis of the lens.

13. The lamp according to claim 1, wherein each of the plurality of subarray modules comprises a plurality of unit array modules, and
wherein each of the plurality of subarray modules has at least one of a triangle shape, a rectangle shape, or a hexagon shape.

14. The lamp according to claim 1, wherein each of the subarray modules comprises a bending portion that does not include the plurality of micro LED chips, and
wherein the plurality of first regions are configured to be distinguished from the plurality of second regions based on the bending portion.

15. The lamp according to claim 1, wherein one of the plurality of first regions defines a vertical cross-section by a plane crossing the first direction, the vertical cross-section having a ring shape.

16. The lamp according to claim 1, wherein the second direction is a direction of the lamp directed toward an outside of the vehicle.

17. The lamp according to claim 1, wherein the array module is horizontally symmetric and the plurality of micro LED chips are disposed at an interval in a vertical direction from a center of the array module toward a periphery of the array module at both sides of the center of the array module.

* * * * *